US010885836B2

(12) United States Patent
Kishimoto

(10) Patent No.: US 10,885,836 B2
(45) Date of Patent: Jan. 5, 2021

(54) DISPLAY APPARATUS

(71) Applicant: Sakai Display Products Corporation, Osaka (JP)

(72) Inventor: Katsuhiko Kishimoto, Osaka (JP)

(73) Assignee: Sakai Display Products Corporation, Osaka (JP)

( * ) Notice: Subject to any disclaimer, the term of this patent is extended or adjusted under 35 U.S.C. 154(b) by 0 days.

(21) Appl. No.: 16/722,272

(22) Filed: Dec. 20, 2019

(65) Prior Publication Data

US 2020/0135099 A1    Apr. 30, 2020

Related U.S. Application Data

(63) Continuation of application No. 15/763,194, filed as application No. PCT/JP2017/032304 on Sep. 7, 2017, now Pat. No. 10,559,252.

(51) Int. Cl.
*G09G 3/3225* (2016.01)
*H01L 51/00* (2006.01)
(Continued)

(52) U.S. Cl.
CPC ......... *G09G 3/3225* (2013.01); *G06F 1/1607* (2013.01); *G09F 9/301* (2013.01);
(Continued)

(58) Field of Classification Search
CPC ............ G09F 9/301; G09F 21/04; G09F 9/35; G09G 3/3225; G06F 1/1607; H01L 51/0097
See application file for complete search history.

(56) References Cited

U.S. PATENT DOCUMENTS

2001/0042262 A1    11/2001    Chu
2006/0125364 A1    6/2006    Takeda et al.
(Continued)

FOREIGN PATENT DOCUMENTS

JP    H03105885 U    11/1991
JP    H07146656 A    6/1995
(Continued)

OTHER PUBLICATIONS

English Translation of International Search Report, PCT Application No. PCT/JP2017/032304, Japan Patent Office. dated Nov. 28, 2017.

*Primary Examiner* — Abbas I Abdulselam
(74) *Attorney, Agent, or Firm* — Snell & Wilmer L.L.P.

(57) ABSTRACT

A display apparatus comprises: a display panel comprising a plurality of display elements arranged in a matrix form on a substrate having flexibility; a supporting member having a surface, the substrate of the display panel being placed on the surface; and a holding member provided at a part of or the entire of an outer edge of the display panel along the outer edge so as to rim the display panel, the holding member holding the display panel on the surface of the supporting member. The holding member engages with an outer periphery of the display panel, the holding member is bonded to the surface of the supporting member, and the substrate closely contacts with the surface of the supporting member at a lower strength than a bonding strength between the holding member and the surface of the supporting member.

16 Claims, 16 Drawing Sheets

(51) Int. Cl.
*G09F 9/30* (2006.01)
*G06F 1/16* (2006.01)
*G09F 9/35* (2006.01)
*G09F 21/04* (2006.01)

(52) U.S. Cl.
CPC ............... *G09F 9/35* (2013.01); *G09F 21/04* (2013.01); *H01L 51/0097* (2013.01)

(56) References Cited

U.S. PATENT DOCUMENTS

| | | | |
|---|---|---|---|
| 2006/0153997 A1* | 7/2006 | Rankin, Jr. | C09K 19/586 428/1.5 |
| 2007/0233376 A1* | 10/2007 | Gershony | H04M 1/6091 455/569.2 |
| 2009/0037273 A1* | 2/2009 | Zhu | G09F 21/04 705/14.62 |
| 2010/0048249 A1 | 2/2010 | Furuta et al. | |
| 2010/0327737 A1* | 12/2010 | Hayashi | B60Q 3/745 313/504 |
| 2012/0156813 A1 | 6/2012 | Kim et al. | |
| 2014/0264300 A1 | 9/2014 | Kamiya | |
| 2015/0072124 A1 | 3/2015 | Sakaguchi | |
| 2016/0187919 A1 | 6/2016 | Gotham et al. | |
| 2016/0291391 A1* | 10/2016 | Yoshida | G02F 1/133308 |
| 2016/0360640 A1* | 12/2016 | Li | H01F 7/064 |
| 2017/0285778 A1* | 10/2017 | Liang | G06K 9/00053 |
| 2018/0053588 A1 | 2/2018 | Barel | |
| 2018/0138257 A1* | 5/2018 | Higano | H01L 27/3244 |
| 2019/0259976 A1 | 8/2019 | Kishimoto | |

FOREIGN PATENT DOCUMENTS

| | | |
|---|---|---|
| JP | 2000305477 A | 11/2000 |
| JP | 2001220558 A | 8/2001 |
| JP | 2004061735 A | 2/2004 |
| JP | 2004069766 A | 3/2004 |
| JP | 2004126451 A | 4/2004 |
| JP | 2005275053 A | 10/2005 |
| JP | 2007271894 A | 10/2007 |
| JP | 2009086115 A | 4/2009 |
| JP | 2014179278 A | 9/2014 |
| JP | 2015161818 A | 9/2015 |
| JP | 2016097650 A | 5/2016 |
| WO | 2013146642 A1 | 10/2013 |

* cited by examiner

DISPLAY APPARATUS

CROSS-REFERENCE TO RELATED APPLICATIONS

This patent application is a continuation of U.S. patent application Ser. No. 15/763,194, having a filing/§ 371(c) date of Aug. 27, 2018 (now U.S. Pat. No. 10,559,252), which is a U.S. National Stage of International Application No. PCT/JP2017/032304, filed on Sep. 7, 2017 (expired).

TECHNICAL FIELD

The present disclosure relates to a display apparatus.

BACKGROUND ART

In recent years, in the field of flat panel display including for example, liquid crystal display apparatus and organic EL display apparatus, as the thinning is in progress, a flexible display panel formed with thin glass substrate or film-like substrate as a base plate for display element starts to become popular. A flexible display panel or an extremely thin display panel is used in a state in which the display panel is bonded to, for example, a surface of a supporting member having an appropriate rigidity in order to obtain a shape retaining property for retaining a suitable shape for a use thereof or a mechanical strength. For example, in Patent Document 1, there is disclosed a method for bonding an image display panel such as a liquid crystal display panel with a window glass used for digital signage. In the method disclosed in Patent Document 1, an image display panel disposed to be spaced from a window glass via an elastic member or the like is pressed towards the window glass while being elastically deformed by rolling of a roller from one end to the other end of the image display panel. Consequently, the image display panel and the window glass are bonded with each other via a layer including a photocurable resin.

PRIOR ART DOCUMENT

Patent Document

Patent Document 1: JP 2016-97650 A

SUMMARY

Problem to be Solved by the Invention

As described above, conventionally, a display panel is bonded with a supporting member such as a window glass by using an adhesive including a resin to be cured by light or a heat. For example, the display panel and the supporting member are rigidly bonded with each other by using an adhesive used in bonding of a polarization plate or a touch panel in manufacture of a display apparatus. However, the display panel and the supporting member are rigidly bonded with each other and thus it is very difficult to detach, from the supporting member, the display panel that is once bonded with the supporting member. Even if the display panel could be detached, debris of the adhesive or remains of the display panel or the supporting member are left on each bonding surface and thus the display panel or the supporting member cannot be easily reused. Therefore, even in a case where a defect occurs with only either one of the display panel and the supporting member, both of them need to be discarded or replaced. For example, in a case where the supporting member is a window glass, when the window glass breaks, the display panel should be discarded along with the window glass even if the display panel maintains normal condition, and when a defect occurs with the display panel, the window glass should be discarded along with the display panel. In particular, in a case where the supporting member is a windshield for vehicle, it is difficult to request, for example, the manufacturer to repair the display panel bonded with the windshield, and thus even in a case where repairing is possible, there may be a case in which both of the display panel and the expensive windshield need to be replaced.

Accordingly, an object of the present disclosure is to provide a display apparatus in which a display panel to be used being fixed to a supporting member can be easily detached from the supporting member.

Means to Solve the Problem

A display apparatus according to Embodiment 1 of the present invention is characterized by comprising: a display panel comprising a plurality of display elements arranged in a matrix form on a substrate having flexibility; a supporting member having a surface, the substrate of the display panel being placed on the surface; and a holding member provided at a part of or the entire of an outer edge of the display panel along the outer edge so as to rim the display panel, the holding member holding the display panel on the surface of the supporting member, wherein the holding member engages with an outer periphery of the display panel, the holding member is bonded to the surface of the supporting member, and the substrate closely contacts with the surface of the supporting member at a lower strength than a bonding strength between the holding member and the surface of the supporting member.

A display apparatus according to Embodiment 2 of the present invention is characterized by comprising: a display panel comprising a plurality of display elements arranged in a matrix form on a substrate having flexibility; and a holding member provided at a part of or the entire of an outer edge of the display panel along the outer edge, so as to rim the display panel, wherein the holding member has flexibility and has a rigidity higher than a rigidity of the substrate, and a weak adhesive layer composed of an adhesive agent is formed on a surface of the substrate opposite to a surface facing the display elements.

Effects of the Invention

According to the embodiments of the present invention, there is provided a display apparatus in which a display panel to be used being fixed to a supporting member can be easily detached from the supporting member.

EMBODIMENT FOR CARRYING OUT THE INVENTION

Next, a display apparatus of the present disclosure will be described with reference to the drawings. Material, shape, size of the constituent elements, and their relative positions illustrated in the embodiments described below are merely illustrative. The display apparatus of the present disclosure is not construed to be limitative thereto.

Embodiment 1

Figure 1:
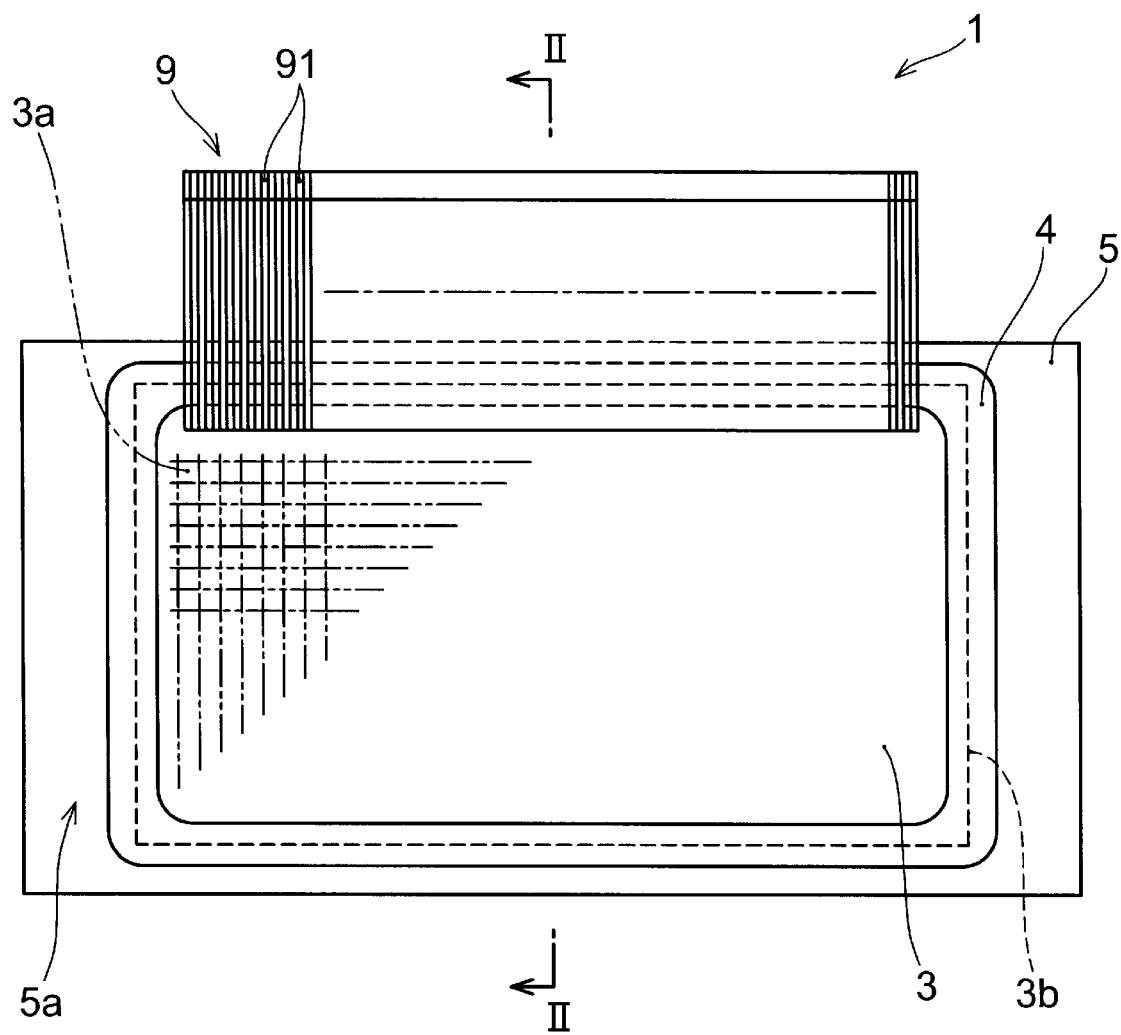
FIG. 1 shows a front view of an example of a display apparatus according to Embodiment 1 of the present invention.
Figure 2:
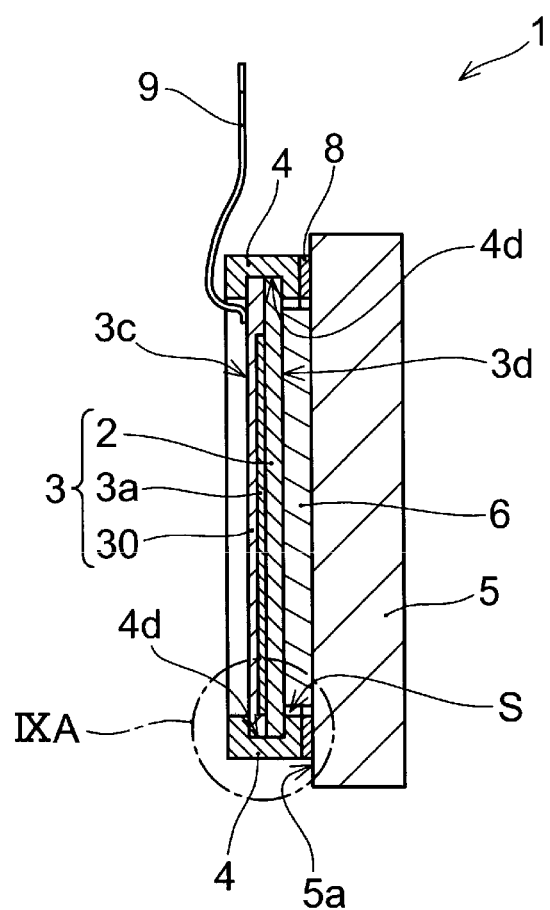
FIG. 2 shows a cross-sectional view along a line II-II of FIG. 1.

In FIG. 1, a front view of a display apparatus 1 of Embodiment 1 is shown, and FIG. 2 shows a cross-sectional view along a line II-II shown in FIG. 1. As shown in FIG. 1 and FIG. 2, the display apparatus 1 comprises: a substrate 2 having flexibility; a display panel 3 comprising a plurality of display elements (pixels) 3a which are arranged in a matrix form on the substrate 2; a supporting member 5 having a surface 5a on which the substrate 2 of the display panel 3 is placed; and a holding member 4, provided along an outer edge (indicated by the dashed line 3b in FIG. 1) of the display panel 3 so as to rim the display panel 3, to hold the display panel 3 on the surface 5a of the supporting member 5. The holding member 4 is provided at a part of or an entire of the outer edge of the display panel 3. In the example of FIG. 1, the holding member 4 is provided at the entire of the outer edge of the display panel 3. In other words, the holding member 4 is provided over the entire outer periphery of the display panel 3 along the outer edge of the display panel 3, and thus the holding member 4 has a frame-like shape as a whole. Inside the holding member 4 having the frame-like shape, the plurality of display elements 3a of the display panel 3 are exposed. Desired image is displayed inside the holding member 4. The holding member 4 engages with an outer periphery of the display panel 3, and is bonded to the surface 5a of the supporting member 5. And the substrate 2 of the display panel 3 closely contacts with the surface 5a of the supporting member 5 at a lower strength than a bonding strength between the holding member 4 and the surface 5a of the supporting member 5.

The display apparatus 1 of FIG. 1 and FIG. 2 comprises a weak adhesive layer 6 composed of an adhesive agent between the substrate 2 of the display panel 3 and the supporting member 5, and the substrate 2 closely contacts with the surface 5a of the supporting member 5 via the weak adhesive layer 6. With the interposition of the weak adhesive layer 6 between the substrate 2 and the surface 5a of the supporting member 5, the display panel 3 and the supporting member 5 are securely brought into close contact with each other. Therefore, lifting of the display panel 3 while the display apparatus 1 is used or air bubble entrapment at an interface between the display panel 3 and the supporting member 5 is prevented. However, the display apparatus 1 of the present embodiment may be not necessarily provided with the weak adhesive layer 6 as with an example described below. Reference numeral 30 indicates a sealing film that protects the display elements 3a. A part of or the whole of the sealing film 30 may be a second barrier layer 38 described below (refer to FIG. 4).

The term "weak adhesive" as used herein refers to the adhesion to an extent enough to adhere to an adhesion object tightly and yet to be released easily from the adhesion object when subjected to a force in a releasing direction without causing any damage to the adhesion object or leaving any glue on the adhesion surface.

An adhesion strength between the weak adhesive layer 6 and either one of or both of the substrate 2 and the supporting member 5 is, for example, 0.02 N/10 mm or more and 5.0 N/10 mm or less, and is preferably 1.5 N/10 mm or more and 2.0 N/10 mm or less. If the adhesion strength of this range is obtained, it is considered that the possibility that the display panel 3 is separated from the supporting member 5 while using the display apparatus 1 is low. In addition, it is considered that when separating the display panel 3 intentionally from the supporting member 5, the display panel 3 and the supporting member 5 can be easily separated from each other merely by pulling the display panel 3 and the supporting member 5 with an appropriate force or merely by inserting a thin plate into the interface and letting air in.

In the examples of FIG. 1 and FIG. 2, the display panel 3 has a rectangular shape at a surface on which an image is to be displayed (the surface drawn at the front side in FIG. 1). The display panel 3 abuts on the holding member 4 in such a manner that the sides, top surface 3c (the opposite surface to the surface facing the supporting member 5), and bottom surface 3d (the surface facing the supporting member 5) of all of the two longer edges and two shorter edges of the rectangular shape abut on the holding member 4. And, the holding member 4 is bonded to the supporting member 5. In the present embodiment, the holding member 4 is bonded to the supporting member 5 by using an adhesive 8 with a bonding strength that does not allow facile separation. Thus, the movements of the display panel 3 is restricted by the holding member 4 in any directions along the surface 5a of the supporting member 5 as well as in a direction to which the panel is separated from the surface 5a, therefore, the display panel 3 is fixed at a predetermined position on the surface 5a of the supporting member 5. In FIG. 2 (and FIG. 7B and FIG. 8 described below), the constituent elements are drawn to be appropriately exaggerated in the thickness direction of the display panel 3 for the sake of clarity. Therefore, with respect to the thickness, the constituent elements are not necessarily drawn at exact ratios in relation to the other constituent elements.

On the other hand, the display panel 3 per se is not rigidly bonded to the supporting member 5, and is merely in close contact with the supporting member 5 because the substrate 2 closely contacts with the surface 5a of the supporting member 5. As described above, the substrate 2 closely contacts with the surface 5a of the supporting member 5 at the lower strength than the bonding strength between the holding member 4 and the surface 5a of the supporting member 5. Therefore, by appropriately selecting the adhesion strength between the substrate 2 and the supporting member 5 and the bonding strength between the holding member 4 and the supporting member 5, the display panel 3 can be easily detached from the supporting member 5 as required while the display panel 3 is held on the supporting member 5 in normal use. For example, in a case where the holding member 4 is an elastic body formed using a silicone resin or the like, the display panel 3 can be detached from the supporting member 5 merely by deforming the holding member 4 and then detaching the display panel 3 from the holding member 4. Even if the holding member 4 cannot be easily deformed, the display panel 3 can be detached from the supporting member 5 without causing severe damage to the display panel 3 or the supporting member 5 by plastically deforming or breaking the holding member 4 which can be prepared at comparatively low cost. If a defect occurs on either one of the supporting member 5 and the display panel 3, an unbroken supporting member 5 or display panel 3 can be reused.

The term "close contact" between the display panel 3 and the supporting member 5 as used herein refers to a state in which the display panel 3 and the supporting member 5 are in tight contact without any space that triggers a separation while receiving certain action which maintains the contact between the display panel 3 and the supporting member 5. Also, the term "close contact" refers a state of the contact which enables the display panel 3 and the supporting member 5 to be separated from each other merely by applying a force in the separating direction without requiring any chemical action for the separation, leaving no remains of the display panel 3 or the supporting member 5 on their separating surface after the separation. Examples of an action of maintaining the state of the contact between the two include, for example, an adhesive action exerted by the weak adhesive layer 6. In a case where the weak adhesive layer 6 is not be provided, the action of maintaining the contact between the display panel 3 and the supporting member 5 may be provided by: a force to press the display panel 3 towards the supporting member 5, which can be applied by the bonding of the holding member 4 to the supporting member 5; an electrostatic force due to a slight electrification of the two; a decompression adsorbing action that can be caused by the two being temporary in contact with each other or close to each other; or the Vander Waals force; or the like. However, the action which brings about the "close contact" between the display panel 3 and the supporting member 5 is not limited to the action mentioned above.

In the present embodiment, the display panel 3 is not bonded to the supporting member 5 but closely contacts with the supporting member 5 as mentioned above. Therefore, a partial separation between the display panel 3 and the supporting member 5 can be prevented. For example, in a case where the display panel 3 is a transparent organic EL display panel formed using a light transmissive material or is a transparent liquid crystal display panel, if there is a separating part between the display panel 3 and the supporting member 5, unevenness may occur in an image recognized by human eyes. However, according to the present embodiment, the display panel 3 and the supporting member 5 closely contact with each other and thus such unevenness can be reduced.

In the examples of FIG. 1 and FIG. 2, the periphery of the display panel 3 is inserted into a groove 4d provided on an interior wall of a frame-like holding member 4 over the entire outer periphery of the display panel 3. In other words, the groove 4d is provided all over the interior wall of the holding member 4 having the frame like shape as a whole. The holding member 4 has a U-shaped cross-sectional shape at all edges of the frame-like shape. The holding member 4 is bonded to the supporting member 5 by the adhesive 8 at the entire of the frame-like shape.

The display apparatus 1 is provided with a wiring 9. The wiring 9 connects the display panel 3 and a driver (not shown) that supplies a drive signal to the display panel 3. The wiring 9 is attached to the display panel 3 at one end of the wiring 9. The one end of the wiring 9 is connected to a contact pad (not shown) provided on a top surface 3c of the display panel 3 by using, for example, an anisotropic conductive film (ACF), the top surface being exposed to the inside of the frame-like holding member 4. In the example shown in FIG. 1, the wiring 9 is connected to a part that lies along one of the two longer edges of the display panel 3. As shown in FIG. 2, in a case where the wiring 9 is drawn out toward the direction to which a side surface of the display apparatus 1 faces, the wiring is drawn out through an upper side of one edge of the frame-like holding member 4 (the region in the opposite direction to the direction toward the supporting member 5). Unlike the example shown in FIG. 1, the wiring 9 may be connected to the display panel 3 at a part along one of the two shorter edges of the display panel 3.

Examples of the wiring 9 include a flexible printed circuit (FPC) having a flexible film formed of a resin such as polyimide or polyethylene terephthalate and a wiring pattern formed on the flexible film using a conductor such as copper. However, the wiring 9 is not limited to the FPC, and any wiring member can be used for the wiring 9. In the example shown in FIG. 1, the wiring 9 comprises a terminal 91 at an opposite end to the one end connected to the display panel 3. The terminal 91 is provided to be adaptive to a connector (not shown) which is provided to the driver mentioned above (not shown). In other words, the terminal 91 has a shape and size that can engage with or merely contact with a contactor of the connector (not shown). In a case where the wiring 9 is a FPC for example, the terminal 91 is, at end of the FPC, an exposed part of the wiring pattern from a protection film (cover lay) provided on the FPC. In a case where the wiring 9 is composed of individual cables, the terminal 91 may be metal fittings for engagement with the connector, which are attached to an end of lead wires constituting the cable. In a case where the wiring 9 is provided with such terminal 91, when the display panel 3 is detached from the supporting member 5, the driver and the display panel 3 can be easily separated from each other. In place of the terminal 91, the wiring 9 may be provided with a connector to engage with the connector provided to the driver. In addition, the wiring 9 may be provided with a connector at the one end to be connected to the display panel 3, and the display panel 3 and the wiring 9 may be connected to each other by way of connector engagement. In that case, when the display panel 3 is damaged, the wiring 9 can be reused for another display panel.

Figure 3:
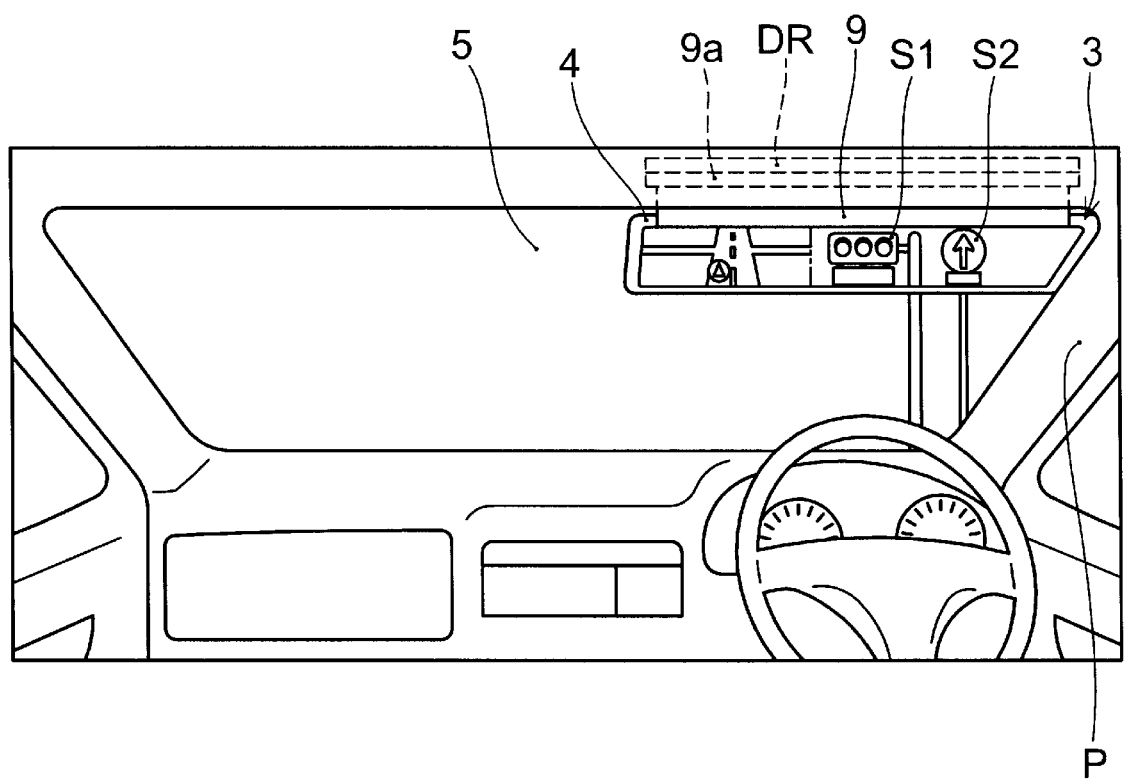
FIG. 3 shows an example of the display apparatus according to Embodiment 1 of the present invention, in which a supporting member is a windshield for vehicle.

FIG. 3 shows an example of the present embodiment, in which the supporting member 5 is a vehicle windshield. In other words, the display panel 3 is held by the holding member 4 on a surface of the windshield as the supporting member 5, the surface facing an interior of the vehicle. In addition, the display panel 3 in the example shown in FIG. 3 is a transparent organic EL display panel formed using a light transmissive material, and in a right side region of the display panel 3 in FIG. 3, light emission of the display elements 3a (refer to FIG. 1) is stopped. Thus, a front side scene, through the windshield, including such as a signal S1 and a variety of traffic signs S2 is visible in the right side region of the display panel 3. Meanwhile, in a left side region of the display panel 3 in FIG. 3, an image produced by a navigation system is displayed by driving the display elements 3a. The display panel 3 may be capable of partially displaying an image on the display screen as in the example of FIG. 3 or not capable of generating such a partial display. In addition, the display panel 3 can be held at any position of the windshield which is the supporting member 5. For example, the display panel 3 having a transverse width which is equivalent to a full width of the windshield may be held in the vicinity of an upper edge or a lower edge of the windshield throughout a vehicle width direction. Further, in addition to the display panel 3 shown in FIG. 3, a display panel other than the display panel 3 of FIG. 3 may be held on a region of the windshield which is in front of a passenger seat with the display screen directed to the passenger seat.

In the example of FIG. 3, the wiring 9 extends to a space between an upholstery material of the ceiling part in the interior of the vehicle and a roof of the vehicle at an upper edge of the windshield. The wiring 9 is inserted into a connector 9a disposed between the upholstery material of the ceiling part and the roof of the vehicle. The connector 9a is coupled to a driver DR to supply a drive signal to the display panel 3. By way of such arrangement, a length of the wiring 9 can be reduced. Also, exposure of the wiring 9 inside the interior of the vehicle can be reduced.

On the display panel 3, any image can be displayed without being limited to the image from the navigation system. For example, an image on a television, an image recorded in any medium such as a DVD, and an image captured by an imaging element connected to the display panel 3 may be displayed on the display panel 3.

As in the example of FIG. 3, in a case where the supporting member 5 is the vehicle windshield and the display panel 3 is the transparent organic EL display panel, by appropriately controlling light emission from the display elements 3a, the view in front of vehicle can be recognized through the display panel 3 from the inside of the interior of the vehicle (such as driver seat, for example) as well as any information can be displayed on the display panel 3. In addition, according to the present embodiment, if either the windshield (supporting member 5) or the display panel 3 is damaged, the display panel 3 can be detached from the windshield without causing severe damage to the unbroken display panel 3 or unbroken windshield. Therefore, it may enable to continuously use the unbroken display panel 3 or unbroken windshield.

Referring to FIG. 1 and FIG. 2 again, the display apparatus 1 of the present embodiment will be further described. The holding member 4 may not be provided necessarily at the entire of the outer periphery of the display panel 3. For example, in a case where the display panel 3 has a rectangular or square shape as shown in FIG. 1, the holding member 4 may be provided only at two of opposing edges or any edges or may be provided at any three edges or only one edge. For example, in the example of FIG. 3 described above, it may be preferable that the holding member 4 is provided only at the edge adjacent to the upper edge of the windshield or at the edge adjacent to a pillar P. This is because these edges are considered to be inconspicuous for eyes of a person in the interior of the vehicle.

The holding member 4 is formed of any material that can hold the display panel 3. Examples of the materials for the holding member 4 include, for example, a synthetic resin such as an epoxy resin or a general purpose plastics, a natural resin such as a natural rubber, and a rubber sponge. The holding member 4 is preferably formed of a material having flexibility. In that case, as described below, when the display panel 3 having flexibility is placed on the supporting member 5, the holding member 4 is curved together with the display panel 3, and thereby, the display panel can be easily placed on the supporting member 5 without entrapping air bubbles. Also, the holding member 4 is preferably formed so as to have an appropriate elasticity. By doing so, when the display panel 3 and the holding member 4 are engaged with each other, for example, the display panel 3 can be easily inserted into the groove 4d of the holding member 4 and can be removed therefrom. Further, the holding member 4 is preferably formed using a light transmissive material. This is because it makes the holding member 4 inconspicuous, and in particular, in a case where the supporting member 5 is formed of a light transmissive material (such as a glass, transparent polyimide, PET, PEN, for example) and the display panel 3 is the transparent organic EL display panel, it hardly produces an opaque portion due to the holding member 4 in the display apparatus 1. In view of these points of view, it is particularly preferable that the holding member 4 is formed using a transparent silicone rubber.

The adhesive 8 used in bonding the holding member 4 to the supporting member 5 is not particularly limited as long as it is possible to develop the bonding strength capable of stably bonding the holding member 4 to the supporting member 5. An arbitrary epoxy adhesive or acrylic adhesive can be used as the adhesive 8. The holding member 4 is preferably bonded to the surface 5a of the supporting member 5 using the light transmissive adhesive 8. As described above, in a case where the holding member 4 is formed using the light transmissive material, it is particularly preferable to use the light transmissive adhesive 8. For example, any adhesive which is called Optical Clear Adhesive (OCA) or Optical Clear Resin (OCR) such as a film-like or paste-like acrylic-based, silicone-based or urethane-based adhesive can be used as the adhesive 8. The bonding strength between the holding member 4 and the supporting member 5 that is obtained by the adhesive 8 is larger than 5.0 N/10 mm and is 10 N/10 mm or less, for example.

Figure 4:
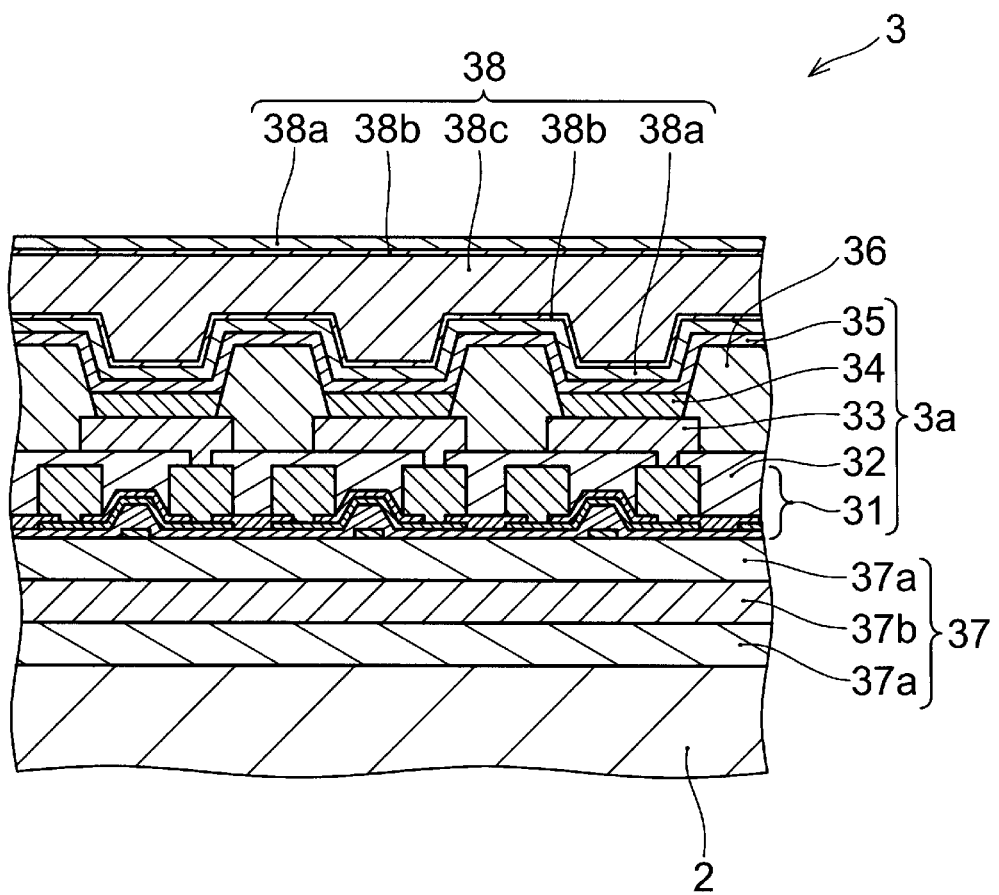
FIG. 4 shows an example of internal structure of a display panel and an example of a barrier layer of a display apparatus according to Embodiment 1 of the present invention.

As described above, examples of the display panel 3 include an organic EL display panel and a liquid crystal display panel. However, the display panel 3 is not limited those panels. In FIG. 4, an example of the structure of the organic EL display panel used as the display panel 3 is shown in an enlarged manner.

As shown in FIG. 4, the display panel 3 includes the substrate 2 and the plurality of display elements 3a formed on the substrate 2. The substrate 2 is a resin film formed using, for example, a polyimide resin. In a case where the display panel 3 is the transparent organic EL display panel, a transparent polyimide resin for example is used as a material for the substrate 2. Each display element 3a has: a TFT (Thin Film Transistor) 31; a first electrode 33 connected to the TFT 31; an organic layer 34 to emit light formed of an organic material vapor-deposited on the first electrode 33; and a second electrode 35 formed on the organic layer 34. Each display element 3a is separated by a bank 36 formed using $SiO_2$ or the like. The first electrode 33 and the bank 36 are formed on a flattening layer 32 that covers the TFT 31.

The TFT 31 is formed using a polycrystalline silicone for example, and is preferably formed of a transparent amorphous oxide semiconductor such as an oxide of indium, gallium, and zinc. In addition, the TFT 31 may be formed using an organic semiconductor material such as pentacene, copper phthalocyanine, fluorinated phthalocyanine. The first electrode 33 is formed of a conductive material having a light transmission property such as an ITO layer. Although the organic layer 34 is shown as a single layer in FIG. 4, this layer can be actually formed to have a multilayered structure including a hole transport layer, a light emitting layer, an electron transport layer or the like. The hole transport layer is formed of an amine-based material for example; the light emitting layer is formed, for example, using a material prepared by doping the host material such as $Alq_3$, BAlq with a dopant according to a light color; and the electron transport layer is formed of, for example, $Alq_3$ or the like. The organic layer 34 may further include a hole injection layer and an electron injection layer which are not shown. The second electrode 35, in order to effectively perform electron injection, is formed of a metal with a small work function such as an Mg—Ag alloy layer or aluminum or an alkaline metal or an alkaline earth metal, and is preferably formed so as to have transparency by forming these materials to be sufficiently thinner than a light wavelength. The cross-sectional structure shown in FIG. 4 is provided as a mere example, and the structure of the organic EL display panel constituting the display panel 3 and materials for the constituent elements are not limited to the structure or materials described herein.

It can be appreciated that in a case where the display panel 3 is the liquid crystal display panel (not shown), the display panel 3 includes: a first substrate having flexibility, which is formed using a very thin glass plate or the like; a second substrate having flexibility, which is disposed to be spaced from the first substrate; and a liquid crystal layer between the first and second substrates. For example, the display panel 3 is provided with: a TFT formed on the first substrate; a pixel electrode connected to the TFT; and a first alignment film formed on the pixel electrode. Further, each liquid crystal display element is provided with a color filter, a common electrode, and a second alignment film, all of which are provided in order on a surface facing the first substrate in the second substrate disposed to be spaced from the first substrate. The liquid crystal layer is composed of a liquid crystal material filled between the first and second alignment films. Further, on each of the respective surfaces of the first substrate and the second substrate, which are opposite to a surface facing the liquid crystal layer, a polarization film is provided. Such liquid crystal display panel is placed on the supporting member 5 so that the first substrate and the supporting member 5 (refer to FIG. 2) face one another. The structure of the liquid crystal display panel that can constitute the display panel 3 in the display apparatus 1 of the present embodiment is not limited to the structure described herein. Any liquid crystal display panel having a flexible substrate and preferably composed of a light transmissive material can be used as the display panel 3 in the display apparatus 1 of the present embodiment. In addition, a light guiding sheet having flexibility and including an edge light may be provided, as a backlight unit, on a surface of the first substrate facing the supporting member 5.

As shown in FIG. 4, the display apparatus 1 of the present embodiment is further comprises barrier layers 37, 38 formed using a moisture impermeable material between the display element 3a and the substrate 2 and on the display elements 3a. In an example of FIG. 4, a first barrier layer 37 is formed between the display elements 3a and the substrate 2. The first barrier layer 37 is specifically provided between the TFT 31 and the substrate 2. In addition, on the display elements 3a, a second barrier layer 38 is formed. A water vapor transmission rate of the first barrier layer 37 and the second barrier layer 38 is $10^{-4}$ g/m$^2$/day or less, for example. The first and second barrier layers 37, 38 are provided as described, resulting that the organic layer 34 which is prone to deteriorate due to a contact with moisture is protected and in the present embodiment, such permeation of moisture passing through the inside of the display panel 3 to an interface between the display panel 3 and the supporting member 5 is strictly prevented. Although the display panel 3 and the supporting member 5 (refer to FIG. 2) closely contact with each other directly or via the weak adhesive layer 6 in the display apparatus 1 of the present embodiment, if moisture or air bubbles enter the interface between the elements, an adhesion strength on the interface may lower. In particular, in a case where the weak adhesive layer 6 is not provided as in examples described below, the adhesion strength may lower due to entry of a small amount of moisture or air bubbles. However, in the example shown in FIG. 4, the entry of moisture to the interface between the display panel 3 and the supporting member 5 is prevented by the first barrier layer 37 and the second barrier layer 38 and thus it is considered that the adhesion strength between the display panel 3 and the supporting member 5 which have been once brought into a state of close contact with each other is easily maintained.

In the example of FIG. 4, the first barrier layer 37 is a multilayered layer including a silicon nitride layer 37a and silicon oxide layer 37b. The silicon oxide layer 37b is put between the two silicon nitride layers 37a, and the first barrier layer 37 has a three-layered structure. Silicon nitride is excellent in barrier performance relative to moisture, and silicon oxide has more flexibility than silicon nitride. Therefore, by forming the first barrier layer 37 so as to be the multilayered layer including the silicon nitride layer 37a and the silicon oxide layer 37b, a barrier layer having a high barrier performance, in which a crack or the like hardly occurs, can be obtained. In addition, a pinhole that can be generated at any position in each layer is closed by another layer and thus a higher barrier performance is obtained. However, the first barrier layer 37 may be a single-layer. The first barrier layer 37 may also be a multilayered layer including a plurality of layers other than three layers as composed of a pair of silicon nitride layer 37a and silicon oxide layer 37b. In addition, the first barrier layer 37 may be formed using a material other than silicon nitride and silicon oxide.

In the example of FIG. 4, the second barrier layer 38 is a multilayered layer including a silicon nitride layer 38a and an organic layer 38c composed of an organic material. The second barrier layer 38, as in the example of FIG. 4, may include a silicon oxide layer 38b between the silicon nitride layer 38a and the organic layer 38c. The organic layer 38c is formed using, for example, an epoxy resin or an acrylic resin, and is put between two silicon oxide layers 38b. In addition, the silicon nitride layer 38a is formed further outside of each of the two silicon oxide layers 38b, respectively, therefore, the second barrier layer 38 exemplified in FIG. 4 has a five-layered structure. The cross-sectional shapes of the silicon nitride layer 38a right above the second electrode 35 and the silicon oxide layer 38b right above the silicon nitride layer has irregularities due to a difference in height between the bank 36 and the organic layer 34. Such irregularities or undesired particles (not shown) adhering to a surface of the display element 3a, or the like, can be embedded in the organic layer 38c that can be flexible. Consequently, on the organic layer 38c, the silicon nitride layer 38a or the like can be stably formed. Also, by interposing the silicon oxide layer 38b, the adhesion strength between the silicon nitride layer 38a and the organic layer 38c can be improved. However, the silicon oxide layer 38b is not necessarily required, and only the silicon nitride layer 38a and the organic layer 38c may be formed. In addition, the organic layer 38c or the silicon oxide layer 38b may not be provided. Further, in place of the silicon nitride layer 38a, a silicon nitride oxide layer that can be formed more quickly than the silicon nitride layer 38a may be provided. The second barrier layer 38 may be a single-layer or may be a multilayered layer including a plurality of layers other than the above-mentioned five layers. Furthermore, the second barrier layer 38 may be formed using an inorganic material other than silicon nitride and silicon oxide (such as silicon nitride oxide or alumina, for example) or an organic material other than an epoxy resin or an acryl resin (such as a silicone resin or a urethane resin for example).

A thickness of the first barrier layer 37 and a thickness of the second barrier layer 38 in a case where the organic layer 38c is not included are, for example, 500 nm or more, preferably 1 micrometer or more and 3 micrometers or less. If the first barrier layer 37 and the second barrier layer 38 have such thickness, a sufficient barrier performance relative to moisture is obtained, and it is considered that a crack hardly occurs with each barrier layer and further the light transmittance is less influenced. The thickness of the silicon nitride layers 37a, 38a is 500 nm or more and 1.5 micrometers or less, for example, and a thickness of the organic layer 38c is of the order of 10 micrometers, for example. A thickness of the silicon oxide layer 38b between the organic layer 38c and the silicon nitride layer 38a is 10 nm or more and 30 nm or less for example.

The supporting member 5 is not particularly limited as to the shape or material as long as it is possible to appropriately support the display panel 3 that can have flexibility. For example, any material such as a glass, a metal or a synthetic resin can be used for the supporting member 5. The supporting member 5 may also be any member constituting other a variety of apparatuses, devices, tools or structures, or part thereof. For example, the supporting member 5 may be a glass plate used in a household window, a show window, an exhibition casing or the like, or alternatively, supporting member 5 may be a casing of a variety of devices or a member constituting the interior wall or exterior wall of building. In addition, the supporting member 5, as described above, may be a vehicle windshield.

Figure 5A:
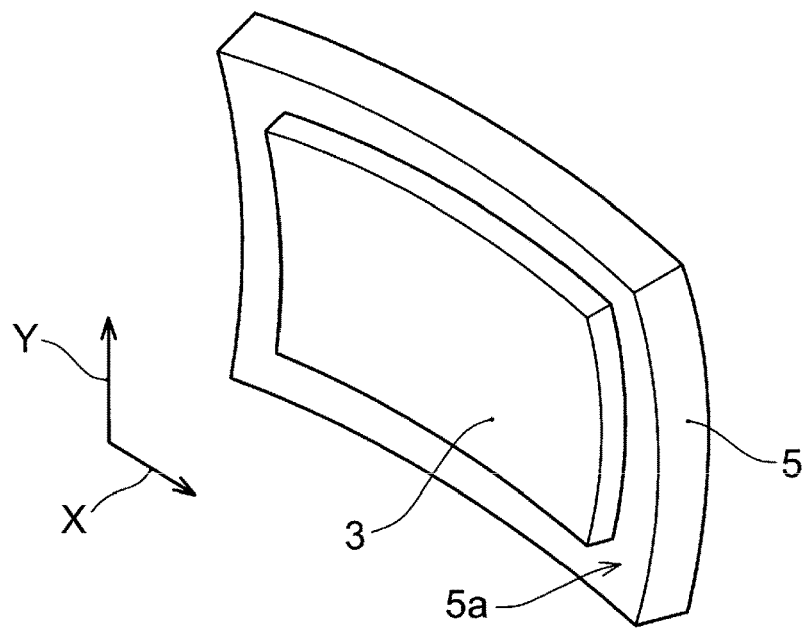
FIG. 5A shows a schematic view of an example of a display apparatus according to Embodiment 1 of the present invention, in which a surface of the supporting member is a quadratic surface.

In a case where the supporting member 5 is the vehicle windshield, the surface 5a of the supporting member 5, on which the display panel 3 is placed, may be a quadratic surface as shown in FIG. 5A. FIG. 5A schematically shows the display panel 3 and the supporting member 5 having the surface 5a which is the quadratic surface. In addition, in FIG. 5B, there is schematically shown a cross section obtained by cutting the supporting member 5 and the display panel 3 placed on the surface 5a that is the quadratic surface along a plane parallel to the thickness direction of the display panel 3. In FIG. 5A, the supporting member 5 is curved in such a way that the surface 5a becomes concave surface in both of the X direction and the Y direction. The display panel 3 that can have flexibility is also curved in conformity with the curved shape of the supporting member 5. However, the surface 5a of the supporting member 5 is the quadratic surface and thus it is inferred that the display panel 3 cannot bend in the same manner as the curved shape of the supporting member 5. In that case, in the display panel 3, a portion lifting up from the supporting member 5 may be produced.

Figure 5B:
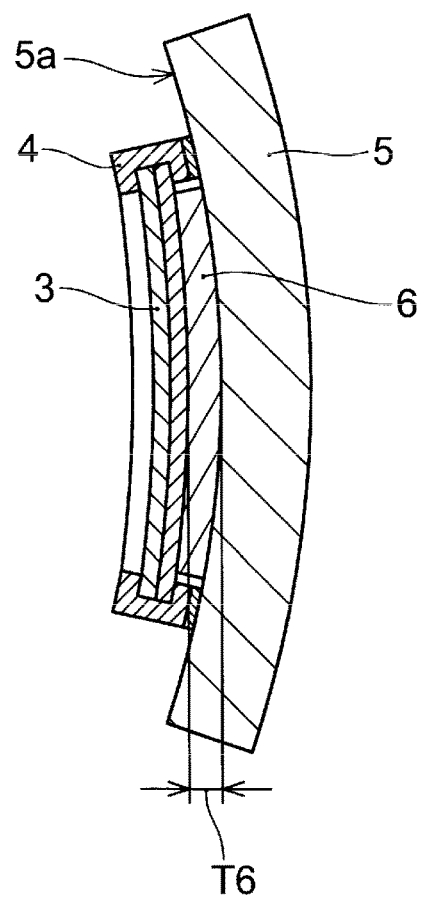
FIG. 5B shows a cross section of a display panel placed on a quadratic surface.

However, in the present embodiment, as shown in FIG. 5B, a thickness T6 of the weak adhesive layer 6 can vary at every position in the display panel 3 based on the curved shape of the quadratic surface, and the state of close contact between the display panel 3 and the supporting member 5 via the weak adhesive layer 6 can be thereby obtained. When the holding member 4 engaging with the display panel 3 is bonded to the supporting member 5, a surface of the weak adhesive layer 6, which faces the display panel 3, is pressurized by uneven pressure due to the difference in curved shape between the display panel 3 and the supporting member 5. Thus, the weak adhesive layer 6, at a portion at which a gap between the display panel 3 and the supporting member 5 is narrow, can contract more than a portion at which a gap therebetween is wider. Also, a part of weak adhesive agent constituting the weak adhesive layer 6, which is in the portion of the weak adhesive layer 6 where the gap between the display panel 3 and the supporting member 5 is narrow, can be extruded to the portion of the weak adhesive layer 6 where the gap is wider. Consequently, the thickness T6 of the weak adhesive layer 6 can vary depending on each position in the display panel 3, based on the curved shape of the quadratic surface in the surface 5a of the supporting member 5. Providing the weak adhesive layer 6 in this manner enables to make a close contact between the display panel 3 and the supporting member 5 even when the surface 5a of the supporting member 5 is the quadratic surface.

The weak adhesive layer 6 is composed of an adhesive agent including, for example, acrylic-based, silicone-based, or urethane-based resin solely or in combination of a plurality thereof as main component. The acrylic resin has a superior weather resistance and heat resistance and further has a superior transparency. As described above, in a case where the display panel 3 is the transparent organic EL display panel or the transparent liquid crystal display panel and the supporting member 5 is the glass plate or the like, the weak adhesive layer 6 having a high transparency is preferred in that light transmission property of the display apparatus 1 is less influenced. A silicone-based resin also has a superior weather resistance and transparency and further has a particularly superior weather resistance and hardly turns to yellow and thus is preferred as a material for the weak adhesive layer 6. The weak adhesive layer 6 is formed, for example, by disposing a weak adhesive sheet, which is formed by molding an adhesive agent in a predetermined shape, between the display panel 3 and the supporting member 5.

Figure 6:
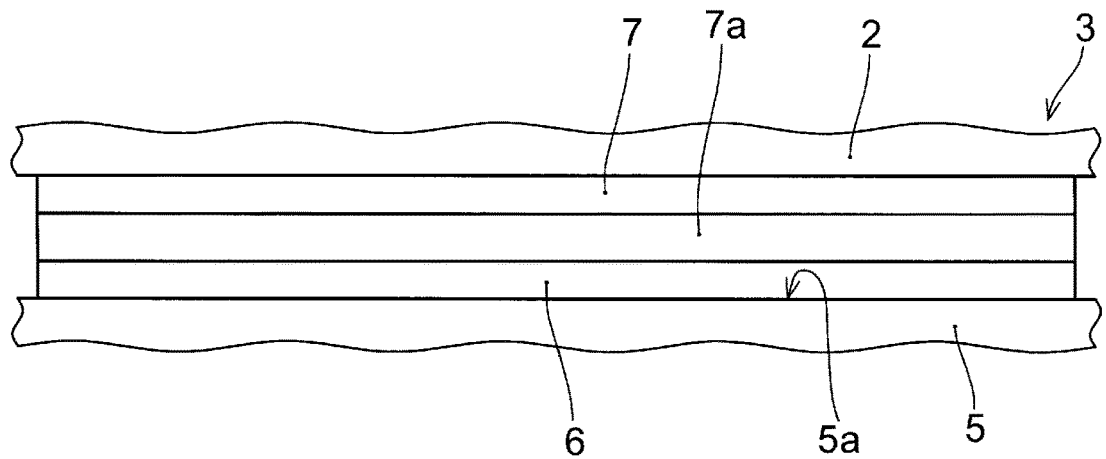
FIG. 6 shows an example of a weak adhesive layer and an example of a strong adhesive layer of a display apparatus according to Embodiment 1 of the present invention.

In FIG. 6, another example of an interface part provided between the substrate 2 and the supporting member 5 in the present embodiment is shown in an enlarged manner. In the example of FIG. 6, in addition to the weak adhesive layer 6, the strong adhesive layer 7 having an adhesive force equal to or more than the adhesive force of the weak adhesive layer 6 is further provided between the substrate 2 and the supporting member 5. The strong adhesive layer 7 is provided between the weak adhesive layer 6 and the substrate 2, and closely contacts with the substrate 2. Meanwhile, the weak adhesive layer 6 is provided between the strong adhesive layer 7 and the supporting member 5, and closely contacts with the supporting member 5. The display panel 3 closely contacts with the surface 5a of the supporting member 5 via the weak adhesive layer 6 and the strong adhesive layer 7. The strong adhesive layer 7 is bonded to the weak adhesive layer 6 via a base material 7a. The strong adhesive layer 7 may be directly bonded to the weak adhesive layer 6 without the base material 7a or the like. The strong adhesive layer 7 and the weak adhesive layer 6 are bonded to each other directly or via the base material 7a at a stronger strength than the adhesive force between the weak adhesive layer 6 and the supporting member 5. In the example of FIG. 6, the strong adhesive layer 7 bonded to the weak adhesive layer 6 in this manner is provided, therefore, the display panel 3 can be detached from the supporting member 5 in a state that the weak adhesive layer 6 is securely adhered to the substrate 2, namely the display panel 3.

Unlike the example of FIG. 6, the strong adhesive layer 7 may closely contact with the supporting member 5 by providing the strong adhesive layer 7 between the weak adhesive layer 6 and the supporting member 5. In addition, the weak adhesive layer 6 may closely contact with the substrate 2 by providing the weak adhesive layer 6 between the strong adhesive layer 7 and the substrate 2. In this case, the display panel 3 can be detached from the supporting member 5 in a state that the weak adhesive layer 6 is securely adhered to the supporting member 5. The strong adhesive layer 7 is preferably brought into close contact with either the display panel 3 or the supporting member 5, whichever has lower failure rate. By having the strong adhesive layer 7, it becomes clear to which the weak adhesive layer 6 remains, the display panel 3 or the supporting member 5, and thus the workability at the time of replacement of the display panel 3 may be improved.

The adhesion strength between the strong adhesive layer 7 and the substrate 2 or the surface 5a of the supporting member 5 is 2.5 N/10 mm or more and 20 N/10 mm or less for example, and preferably 5.0 N/10 mm or more and 20 N/10 mm or less. As in the example of FIG. 6, when the strong adhesive layer 7 closely contacts with the substrate 2, the adhesion strength between the weak adhesive layer 6 and the supporting member 5 is, for example, 0.02 N/10 mm or more and 5.0 N/10 mm or less as described above. However, the adhesion strength between the strong adhesive layer 7 and the substrate 2 is larger than the adhesion strength between the surface 5a of the supporting member 5 above which said substrate 2 is placed and the weak adhesive layer 6, and the adhesion strength between the strong adhesive layer 7 and the surface 5a of the supporting member 5 is larger than the adhesion strength between the substrate 2 placed above said supporting member 5 and the weak adhesive layer 6. As long as such relation among the adhesion strength is maintained, the display panel 3 can be detached in a state that the weak adhesive layer 6 is securely adhered to a desired element (display panel 3 or supporting member 5). The weak adhesive layer 6, for example, is provided on a first surface of the film-like base material 7a formed with polyethylene terephthalate or the like, and the strong adhesive layer 7 is provided on a second surface that is an opposite surface to the first surface of the base material 7a. In addition, the weak adhesive layer 6 and the strong adhesive layer 7 may be disposed between the display panel 3 and the supporting member 5 in a state of a double-sided adhesive sheet including the base material 7a and having three-layer structure.

Figure 7A:
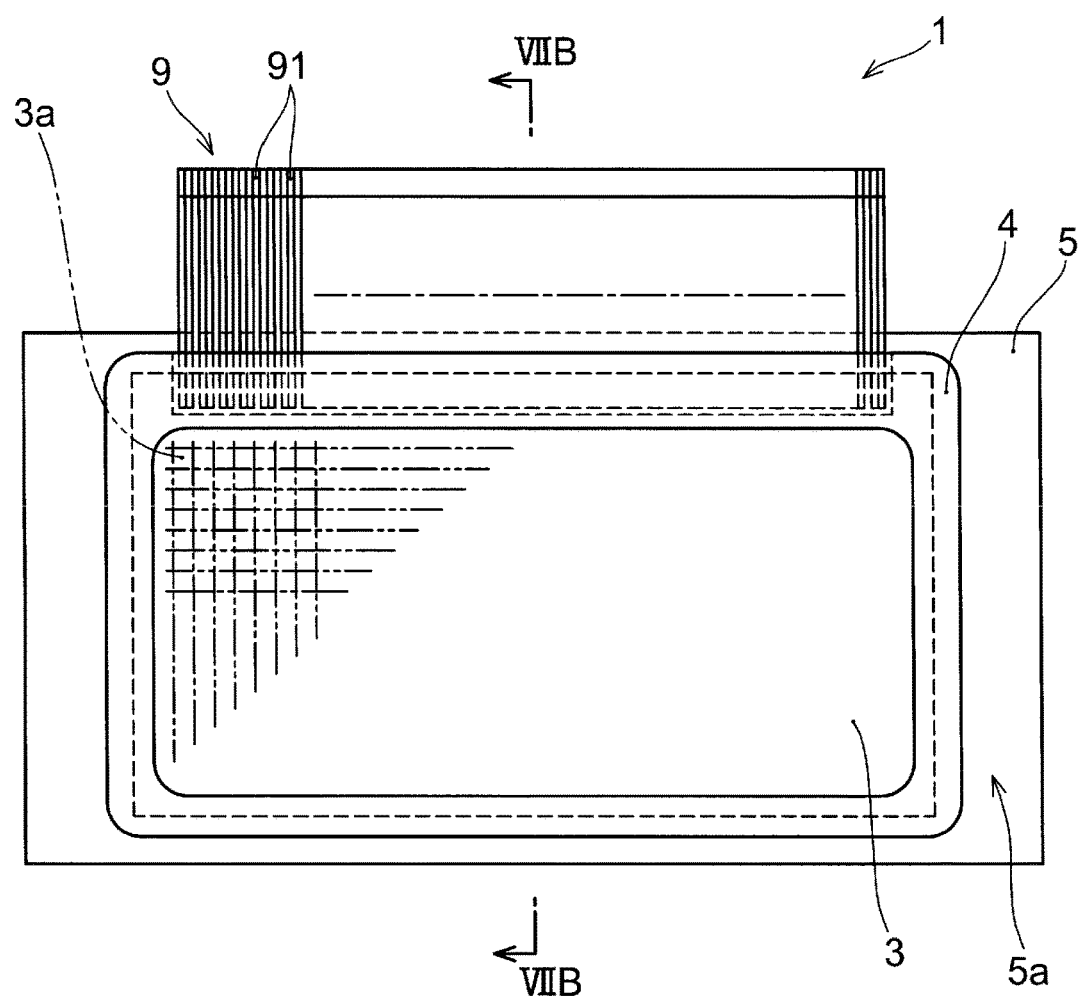
FIG. 7A shows a front view of another example of a display apparatus according to Embodiment 1 of the present invention.
Figure 7B:
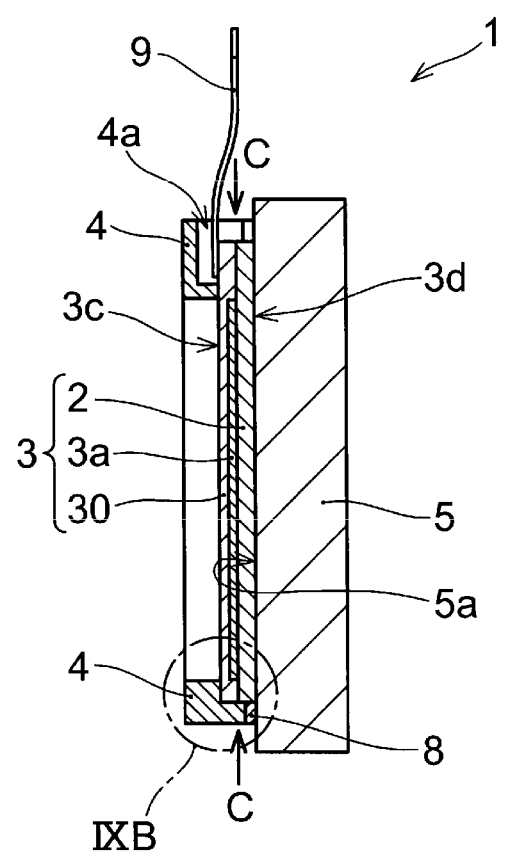
FIG. 7B shows a cross-sectional view along a line VIIB-VIIB of FIG. 7A.
Figure 8:
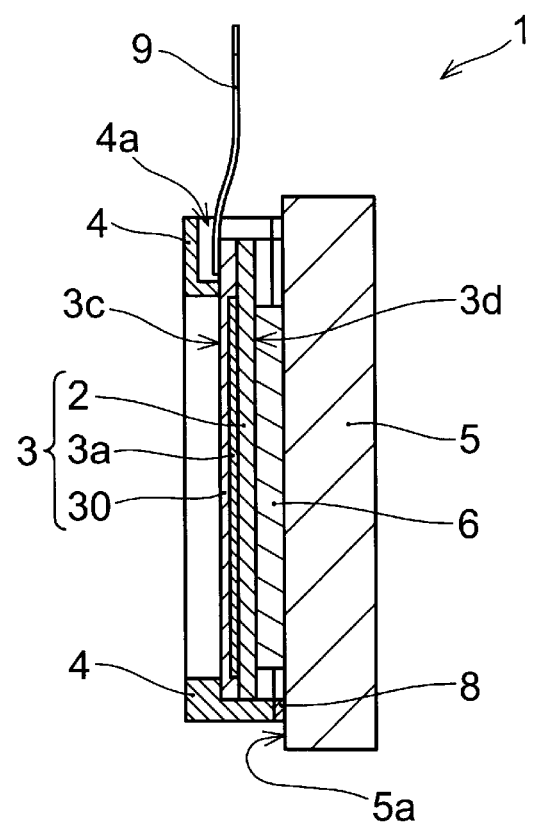
FIG. 8 shows a cross-sectional view of yet another example of a display apparatus according to Embodiment 1 of the present invention.

In FIG. 7A and FIG. 7B, another example of the display apparatus 1 according to Embodiment 1 is shown. The example in FIG. 7A and FIG. 7B is an example in which the weak adhesive layer 6 (refer to FIG. 2) is not provided. In FIG. 7A, FIG. 7B and FIG. 8 described below, the same constituent elements as those in FIG. 1 and FIG. 2 are referred to with the same reference numerals, and a detailed description thereof will be appropriately omitted. The display panel 3 may be brought into close contact with the supporting member 5 not by the adhesive action of the weak adhesive layer 6 but by, for example, the press with the holding member 4, an electrostatic action, or a decompression adsorbing action as described above. Also, in the examples of FIG. 7A and FIG. 7B, the holding member 4, at the outer periphery of the display panel 3, abuts on only the top surface 3c and side surface of the display panel 3, and does not abut on the bottom surface 3d of the display panel 3. In other words, the holding member 4 having the frame-like shape as a whole has a cross-sectional shape of a substantially L-contour at each edge thereof, and abuts on the top surface 3c and side surface of the display panel 3 at two surfaces directed to the inside of the L-shape. In addition, the substrate 2 of the display panel 3 closely contacts with the supporting member 5 with the entire bottom surface 3d.

The holding member 4 includes, at a portion facing the wiring 9, a concave portion 4a provided by making a thickness of the concave portion 4a in the axial direction of the flame-like shape thinner than those of the other portions. A connection part between the wiring 9 and the display panel 3 is housed into this concave portion 4a, and the wiring 9 is drawn out from the concave portion 4a to the outside of the display apparatus 1. The connection part between the wiring 9 and the display panel 3 can be protected from an external stress by the holding member 4. In addition, the connection part between the wiring 9 and the display panel 3 is hidden inside the holding member 4, and the appearance of the display apparatus 1 may be thereby improved. The holding member 4 does not have a portion which is interposed between the supporting member 5 and the display panel 3 at each edge, so that the holding member 4 can be easily combined with the display panel 3 from above the top surface 3c of the display panel 3. Therefore, the connection part between the wiring 9 and the display panel 3 can be easily housed in the concave portion 4a. Furthermore, the connection part between the wiring 9 and the display panel 3 may be covered with a protection member composed of an epoxy resin or the like although the protection member is not shown.

In FIG. 8, there is shown an example of the display apparatus 1 provided with the weak adhesive layer 4 and the holding member 4 having an L-shaped cross-sectional shape at each edge as shown in FIG. 7A and FIG. 7B. In the example shown in FIG. 8, as in the example shown in FIG.

7A and FIG. 7B, the holding member 4 abuts on only the top surface 3c and the side surface of the display panel 3. In addition, the substrate 2, in other words, the bottom surface 3d of the display panel 3 closely contacts with the surface 5a of the supporting member 5 via the weak adhesive layer 6 without contact with the holding member 4. Further, in the holding member 4 in the example of FIG. 8 as well, the concave portion 4a is formed at a portion facing the wiring 9, and the connection part between the wiring 9 and the display panel 3 is housed in the concave portion 4a.

Figure 9A:
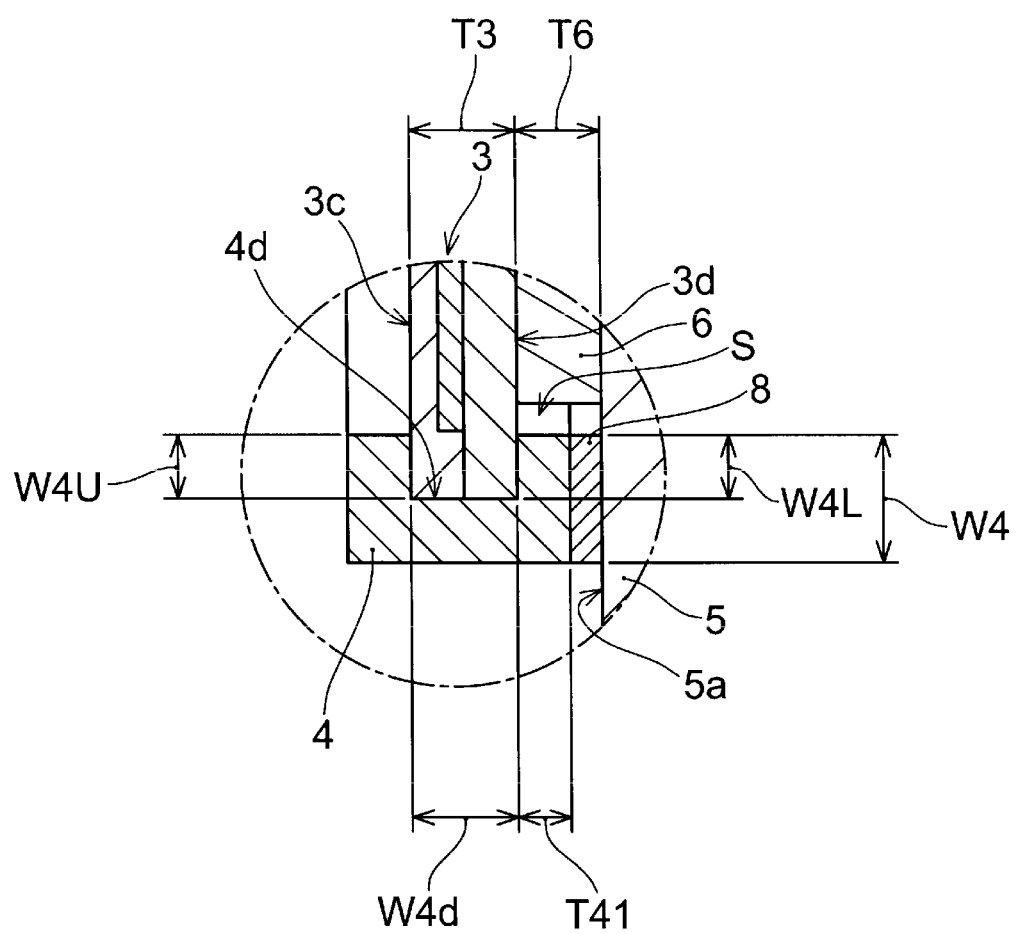
FIG. 9A shows an enlarged view of a portion IXA of FIG. 2.

In FIG. 9A, an enlarged view of the portion IXA in FIG. 2 is shown. Dimensions of the each part of the holding member 4 are determined so that the weak adhesive layer 6 and both the display panel 3 and the supporting member 5 securely contact with each other. For example, a thickness T41 of a portion of the holding member 4 between the display panel 3 and the supporting member 5 is selected not to cause a problematic warp or the like with the display panel 3 on the basis of the thickness T6 of the weak adhesive layer 6 as well as considering a thickness of the adhesive 8 if necessary. For example, the thickness of the holding member 4 is 0.2×T6 or more and 1.0×T6 or less. In a case where the thickness T41 falls in the range of such thickness, the display panel 3 is not easily lifted from the weak adhesive layer 6 and it is considered that the display panel 3 is stably held. In addition, a width W4d of the groove 4d is 0.9×T3 or more and 1.0×T3 or less. T3 is a thickness of the display panel 3. If the width of the groove 4d falls in such a range, lifting of the display panel 3 from the weak adhesive layer 6 is effectively prevented and it is considered that an excessive stress is not applied to a periphery of the display panel 3.

In addition, a width W4 of each edge of the holding member 4 is 0.01×L3 or more and 0.2×L3 or less for example, and preferably 0.02×L3 or more and 0.05×L3 or less. L3 is a length (width) of the display panel 3 in the direction of the width W4 of each edge of the holding member 4. If each edge of the holding member 4 has such a width, it is considered that the holding member 4 and the display panel 3 are securely held on the surface 5a of the supporting member 5 by adhesive force of the adhesive 8 and the holding member 4 is inconspicuous in the user's field of vision. Further, at the each edge of the frame-like holding member 4, lengths W4U and W4L of each of a pair of contact parts constituting two opposite interior walls of the groove 4d and abutting on the display panel 3 are, for example, 3.0×T3 or more and 8.0×T3 or less (in FIG. 9A, it is not intended that the lengths W4U, W4L and the thickness T3 of the display panel 3 are shown at exact ratios). It is considered that the display panel 3 is securely held by the contact parts having such a length. The length W4U of the contact part facing the top surface 3c of the display panel 3 and extending to the inside of the frame-like holding member 4 and the length W4L of the contact part facing the bottom surface 3d of the display panel 3 and extending to the inside of the frame-like holding member 4 may be different from each other. In that case, as described below, the holding member 4 may be easily attached to the periphery of the display panel 3.

Figure 9B:
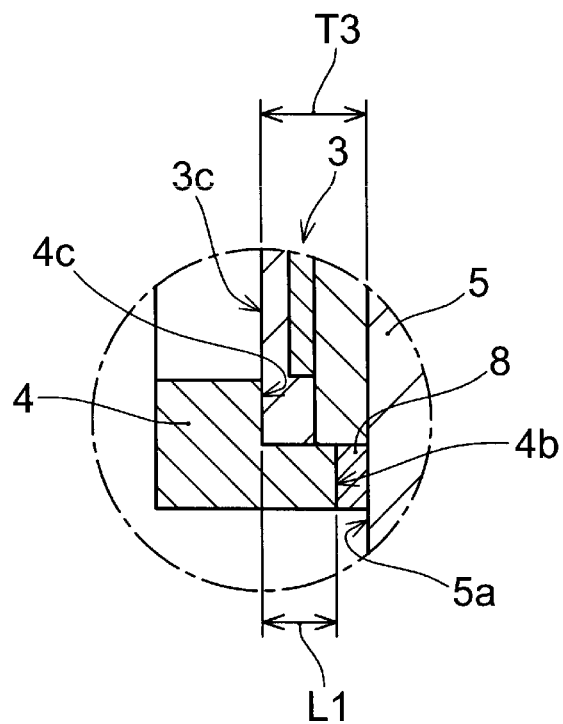
FIG. 9B shows an enlarged view of a portion IXB of FIG. 7B.

In addition, in FIG. 9B, an enlarged view of the portion IXB in FIG. 7B is shown. In the display apparatus 1 shown in FIG. 7B, a dimension L1 in FIG. 9B is set at an appropriate length, and the display panel 3 can be thereby pressed towards the supporting member 5. In this manner, the display panel 3 and the supporting member 5 can be brought into close contact with each other. The dimension L1 is a length from a surface 4b to a surface 4c in the holding member 4 in which the surface 4b is a surface facing the supporting member 5 and the surface 4c is a surface abutting on the top surface 3c of the display panel 3. Here, in a case where the display panel 3 is pressed at a pressure of 1 hPa (Fa1) or more and 1,013 hPa (Fa2) or less, the display panel 3 and the supporting member 5 can be brought into appropriate close contact with each other without applying an excessive load to the display panel 3. Therefore, in a case where the thickness of the adhesive 8 is thin enough to ignore, the dimension L1 is set at a length of T3×E4/(Fa2× A3/A4+E4) mm or more and T3×E4/(Fa1×A3/A4+E4) mm or less, and the display panel 3 can be thereby appropriately pressed by the holding member 4. T3 is a thickness (unit: mm) of the display panel 3: E4 is a Young modulus (unit: hPa) of the holding member 4; and A3 is an area (unit: $m^2$) of the display panel 3. Further, A4 is a cross-sectional area (unit: $m^2$) of a portion of the holding member 4, which stretches when the holding member 4 is bonded to the supporting member 5 while engaging with the display panel 3 (for example, a cross-sectional area of the holding member 4 at the arrows C in FIG. 7B).

The cross-sectional shape of each edge of the holding member 4 is not limited to the shapes shown in FIG. 2, FIG. 7B, and FIG. 8, and may be any shape which is capable of engaging with the periphery of the display panel 3. For example, the holding member 4 may not have a cross-sectional shape at each edge, such as U-shape or L-shape which is suitable for engaging with the display panel 3. For example, in a case where the holding member 4 is an elastic body, the edge of the display panel 3 may bite into the interior wall of the holding member 4 when the holding member 4 is engaged with the display panel 3, thereby holding the display panel 3. In addition, the holding member 4 may hold the display panel 3 merely by way of frictional force between the interior wall of the holding member 4 and the edge of the display panel 3.

In the example shown in FIG. 1 and FIG. 2 described above, the holding member 4 has a frame-like shape which surrounds the display panel 3 at the entire of the outer edge. In addition, a space S (refer to FIG. 2 and FIG. 9A) surrounded by the holding member 4, the supporting member 5 and the display panel 3 is formed between the display panel 3 and the supporting member 5, and the weak adhesive layer 6 is disposed inside the space S. The space S may be an airtight space which is produced by bringing the holding member 4 and the display panel 3 into airtight contact with each other and bonding the holding member 4 and the supporting member 5 to each other in an airtight manner. In that case, it is considered that permeation of water or air to the interface between the weak adhesive layer 6 and the display panel 3 as well as the interface between the weak adhesive layer 6 and the supporting member 5 hardly occurs, and separation on those hardly occurs.

Figure 10A:
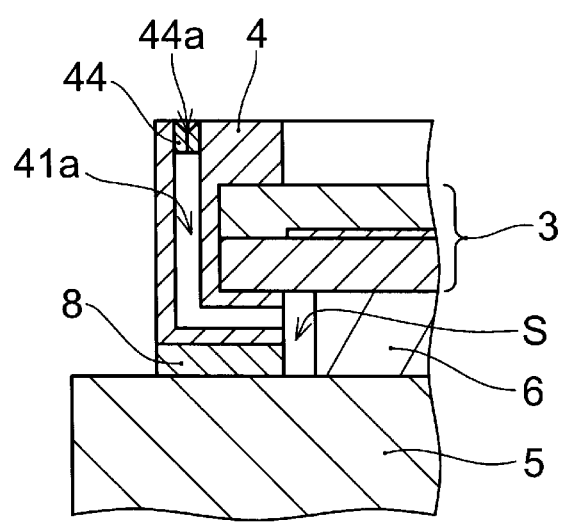
FIG. 10A shows another example of a holding member of a display apparatus according to Embodiment 1 of the present invention.
Figure 10B:
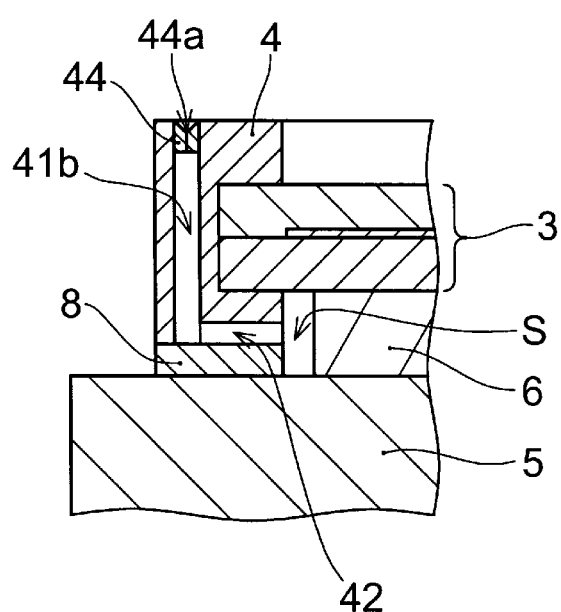
FIG. 10B shows yet another example of a holding member of a display apparatus according to Embodiment 1 of the present invention.

Further, in the case of a structure such that the space S is formed, the air inside the space S is discharged to the outside of the display apparatus 1, and the display panel 3 and the supporting member 5 can be thereby brought into more secure close contact with each other. In addition, it enables to reduce penetration of the air inside the space S or moisture therein to the interface between the weak adhesive layer 6 and the display panel 3 or the supporting member 5. The holding member 4 may be provided with means for discharging such air inside the space S. In FIG. 10A and FIG. 10B, examples of the holding member 4 provided with such means are shown.

In FIG. 10A and FIG. 10B, a cross section of an arbitrary edge of the holding member 4 having a frame-like shape as a whole is shown. In an example shown in FIG. 10A, the holding member 4 has a through hole 41a through which the inside and the outside of the flame-like shape in the holding member 4 are communicated. The through hole 41a forms a suction port for discharging the air of the space S. The through hole 41a has openings on the upper surface of the holding member 4 and on a surface of the interior wall of the holding member 4 having the frame-like shape, and has an L-shaped cross-sectional shape. The through hole 41a may penetrate the holding member 4 between the surface of the interior wall and a surface of the exterior wall of the holding member 4. The holding member 4 is further provided with a closing member 44 arranged in the through hole 41a in the vicinity of the upper surface of the holding member 4 so as to prevent ventilation through the through hole 41a.

In addition, in an example shown in FIG. 10B, the holding member 4 is provided with: a through hole 41b having openings on the upper surface and on the lower surface of the holding member 4; and a groove 42 formed along the lower surface of the holding member 4 and connected to the through hole 41b. The inside and the outside of the holding member 4 are communicated through the groove 42 and the through hole 41b, and a suction port for discharging the air of the space S is formed by the groove 42 and the through hole 41b. The holding member 4 is further provided with the closing member 44 arranged in the through hole 41b in the vicinity of the upper surface of the holding member 4 so as to prevent ventilation through the through hole 41b and the groove 42.

In the examples of FIG. 10A and FIG. 10B, the closing member 44 is an elastic body having a ventilation path 44a passing through the closing member 44, and is pressed into the through holes 41a, 41b. The closing member 44 can be formed of, for example, a natural rubber, a synthetic rubber such as a butadiene rubber or a styrene butadiene rubber or a silicone rubber. The closing member 44 is pressed into the through hole 41a or the through hole 41b, and thereby, the ventilation path 44a is pressed by the interior wall of the surrounding closing member 44, and is normally closed. Thus, during normal operation, the ventilation through the through holes 41a, 41b and the groove 42 is prevented by the closing member 44. When the air inside the space S is discharged, a tubular material such as a needle (not shown) is pushed against the interior wall of the surrounding closing member 44 and inserted into the ventilation path 44a. Then, the air inside the space S can be discharged using a pump or the like (not shown) via a tubular material such as a needle inserted into the ventilation path 44a.

The closing member 44 shown in FIG. 10A and FIG. 10B is merely one of examples, and the closing member 44 may have a different structure from the examples shown in these drawings. For example, the closing member 44 may be a covering material prepared so as to be attachable to and detachable from the opening of the through holes 41a, 41b. In addition, the closing member 44 may be a check valve which is disposed inside the through hole 41a, 41b, and abuts on a stepped portion provided on the interior wall of the through hole 41a, 41b when it is withdrawn by the negative pressure toward the space S in the reduced pressure state so as to close the through hole 41a, 41b.

Embodiment 2

Figure 11A:
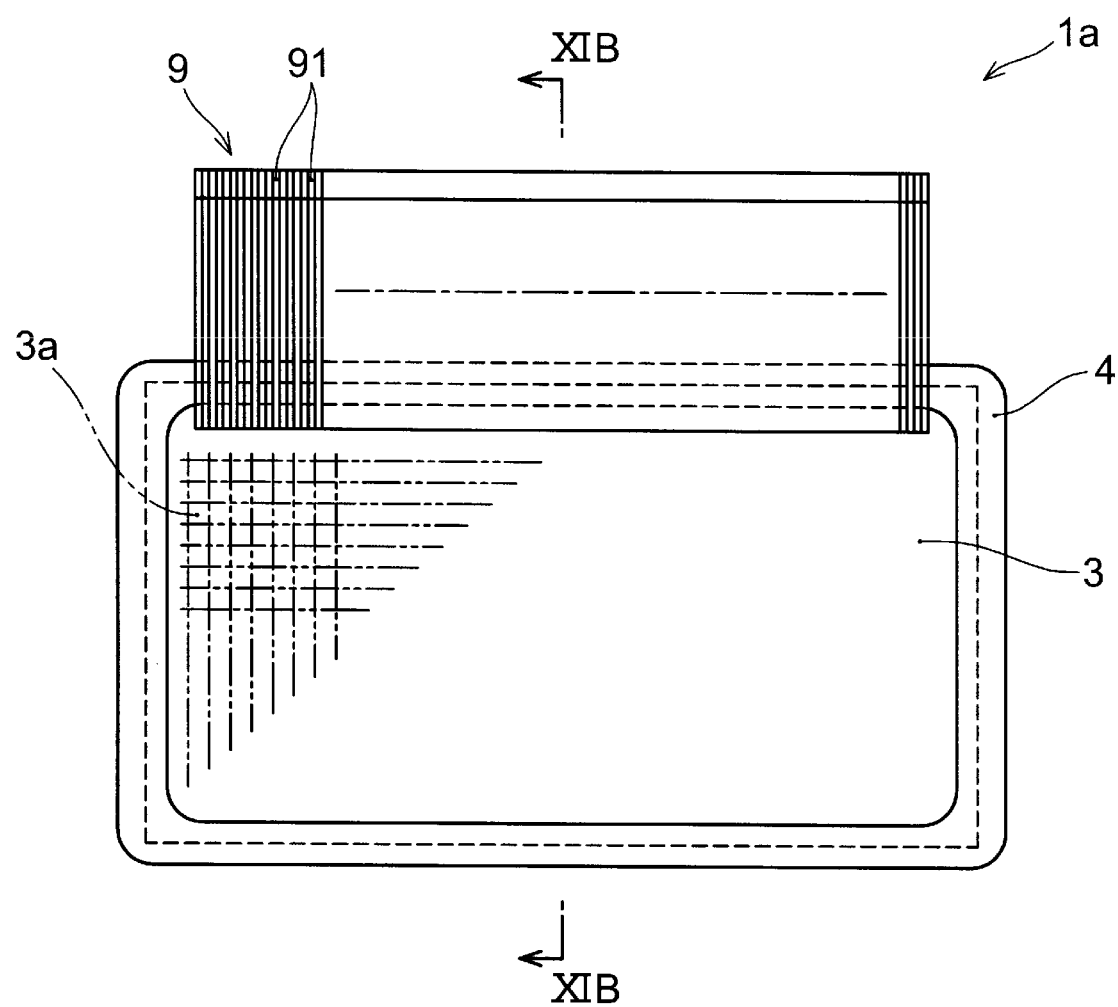
FIG. 11A shows a front view of a display apparatus according to Embodiment 2 of the present invention.
Figure 11B:
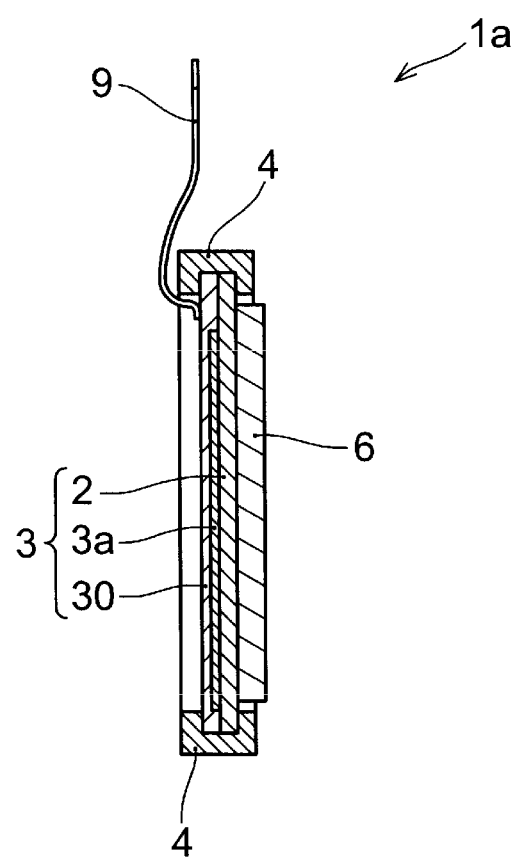
FIG. 11B shows a cross-sectional view along a line XIB-XIB of FIG. 11A.

Next, a display apparatus according to Embodiment 2 will be described referring to FIG. 11A and FIG. 11B showing a display apparatus 1a which is an example of Embodiment 2. In FIG. 11A and FIG. 11B, the same constituent elements as those included in the display apparatus 1 according to Embodiment 1 are referred to with the same reference numerals, and a detailed description thereof will be appropriately omitted.

The display apparatus 1a according to Embodiment 2 comprises: a substrate 2 having flexibility; a display panel 3 comprising a plurality of display elements 3a which are arranged in a matrix form on the substrate 2; and a holding member 4 provided along an outer edge of the display panel 3 so as to rim the display panel 3. The holding member 4 is provided at a part of or the entire of the outer edge of the display panel 3. In an example of FIG. 11A, the holding member 4 is provided at the entire of the outer edge of the display panel 3, and has a frame-like shape as a whole. The holding member 4 has flexibility and has a rigidity higher than a rigidity of the substrate 2. In addition, on a surface of the substrate 2 opposite to a surface facing the display elements 3, a weak adhesive layer 6 composed of an adhesive agent is formed. The weak adhesive layer 6 is composed of an adhesive agent including, for example, an acrylic-based, silicone-based, or urethane-based resin solely or in combination of a plurality thereof as main component. As shown in FIG. 11A and FIG. 11B, the display apparatus 1a according to Embodiment 2 is not provided with a supporting member 5 unlike the display apparatus 1 according to Embodiment 1. Except for this matter, the display apparatus 1a according to Embodiment 2 has the substantially same structure as the display apparatus 1 according to Embodiment 1 shown in FIG. 1 and FIG. 2.

The display apparatus 1a is not provided with a member to support the display panel 3 that may be flexible, and thus, the display apparatus 1a is used being placed on an arbitrary external support, for example, a glass plate, a various article, or a building. However, the display panel 3 that may be flexible hardly has a sufficient shape retaining property and thus handling of the display panel 3 may be cumbersome until the display panel 3 is supported by the external support. Accordingly, the display apparatus 1a according to Embodiment 2 is comprises the holding member 4 having a higher rigidity than at least a rigidity of the substrate 2 so that the display panel 3 can be easily handled until the display panel 3 is supported by the external support.

In addition, when the display panel 3 is placed on the external support, the display panel 3 is subsequently placed on the external support from the one end (FIG. 12C) while being bended so that air bubbles or the like are not entrapped between the display panel 3 and the external support. The display apparatus 1a according to Embodiment 2 comprises the holding member 4 having flexibility so that, for example, such manner can be used.

As described above, the holding member 4 according to Embodiment 1 is formed of an arbitrary synthetic resin or a natural resin and is preferably formed of a transparent silicone rubber. Each of such materials is considered to sufficiently develop a higher rigidity than a rigidity of the substrate 2 formed using a polyimide film having a thickness of the order of about 10 micrometers when molded in the shape of the holding member 4. In addition, a variety of rubbers or silicone resins can have flexibility. Therefore, the holding member 4 in the display apparatus 1a according to Embodiment 2 can also be formed using any material similar to the material of the holding member 4 of Embodiment 1 and capable of developing flexibility and a higher rigidity than a rigidity of the substrate 2.

In addition, it is preferable that even in a case in which the display apparatus 1a according to Embodiment 2 is placed on any external support, the display apparatus 1a is capable of coming into close contact satisfactorily with the support. Accordingly, the display apparatus 1a of the present embodiment comprises the weak adhesive layer 6. Thus, for example, even if the external support has a property or surface condition which hardly comes into close contact with the display panel 3, the display panel 3 and the external support easily come into close contact with each other. Moreover, since the display panel 3 and the external support come into close contact with each other via the weak adhesive layer 6 the display panel 3 is easily detached from the support after use of the display apparatus 1a and can be placed on another support and used.

Individual elements constituting the display apparatus 1a according to Embodiment 2 have the same structures as the constituent elements referred to with the same reference numerals in the display apparatus 1 according to Embodiment 1 and can be formed using the same materials. In addition, the modified examples set forth in the above description with respect to Embodiment 1, expect for those concerning the supporting member 5, can be applied to the display apparatus 1a according to Embodiment 2 as well. For example, the display apparatus 1a of Embodiment 2 may be provided with the first barrier layer 37 and the second barrier layer 38 (refer to FIG. 4), and/or the strong adhesive layer 7 (refer to FIG. 6) may be bonded to the weak adhesive layer 6 of the display apparatus 1a. In addition, the holding member 4 of the display apparatus 1a may have a cross-sectional shape shown in FIG. 7B or FIG. 8, and therefore, a connection part between the wiring 9 and the display panel 3 may be housed in the concave portion 4a (refer to FIG. 7B) provided on the holding member 4.

Method for Manufacturing Display Apparatus

A method for manufacturing display apparatus according to Embodiment 1 will be described referring to FIG. 12A to FIG. 12C and FIG. 13.

Figure 12A:
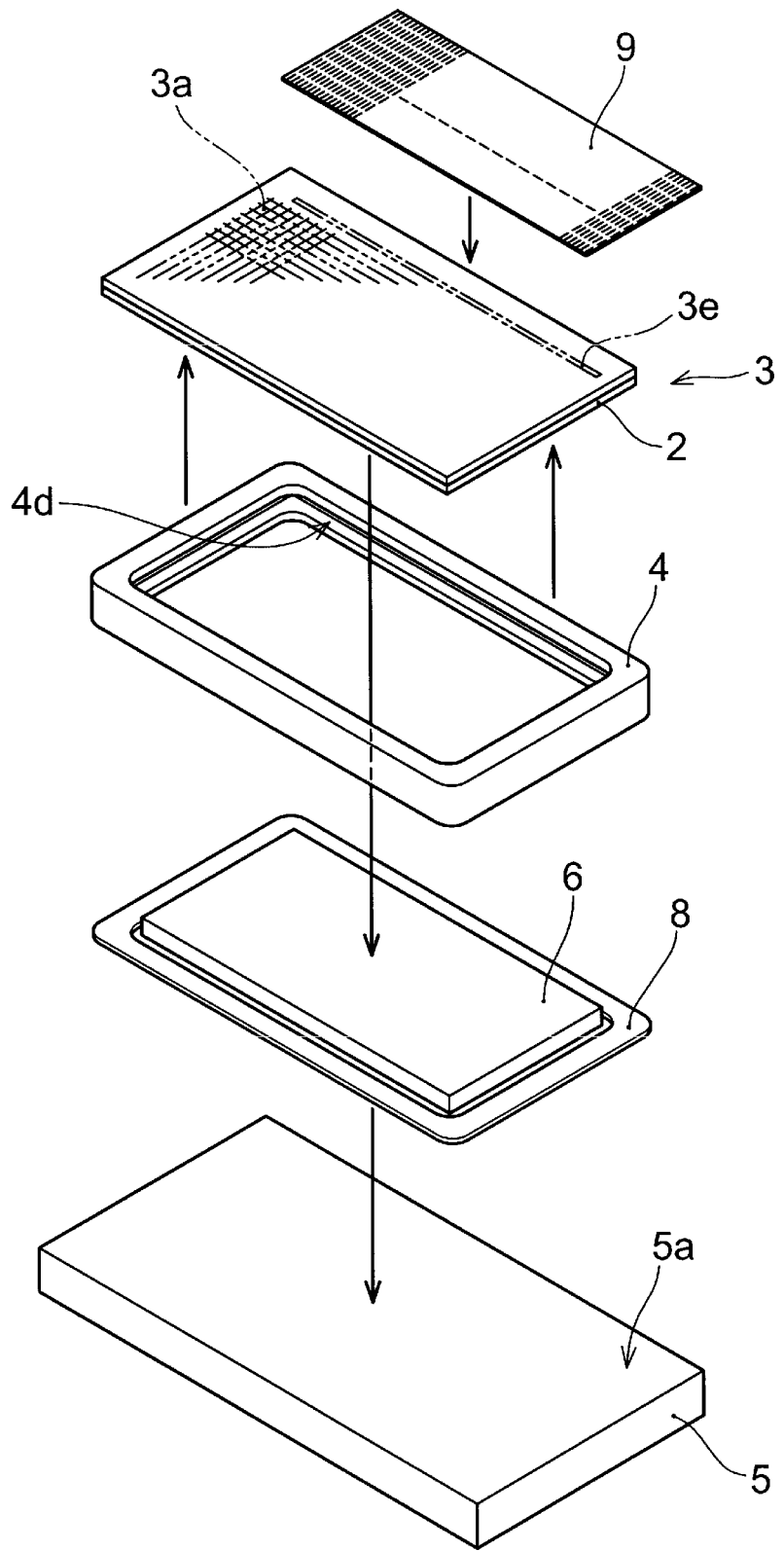
FIG. 12A shows an example of method for manufacturing display apparatus according to Embodiment 1 of the present invention.

As shown in FIG. 12A, the method for manufacturing display apparatus according to Embodiment 1 includes: forming a display panel 3 by forming a plurality of display elements 3a on a substrate 2 having flexibility; and providing a holding member 4 at a part of or the entire of an outer edge of the display panel 3 along the outer edge, the holding member 4 engaging with an outer periphery of the display panel 3. FIG. 12A shows an example in which the holding member 4 is provided at the entire of the outer edge of the display panel 3. The method for manufacturing display apparatus according to Embodiment 1 further includes: preparing a supporting member 5 having a surface 5a on which the substrate 2 of the display panel 3 is to be placed; bonding the holding member 4 to the surface 5a of the supporting member 5; and bringing the substrate 2 into close contact with the surface 5a of the supporting member 5 at a strength lower than a bonding strength between the holding member 4 and the surface 5a of the supporting member 5. Further details will be described below.

First, formation of the display panel 3 will be described referring to FIG. 4 mentioned above. An organic EL display panel or a liquid crystal display panel is exemplified for the display panel 3. In a case where an organic EL display panel is formed as the display panel 3, organic EL display elements (display elements 3a) including a TFT 31 and an organic layer 34 are formed on a flexible substrate 2 formed by, for example, a slot die coating using, for example, a polyimide resin. At this step, preferably, a first barrier layer 37 is formed by depositing at least two layers between the substrate 2 and the display elements 3a using a moisture impermeable material. Examples of the moisture impermeable material include silicon nitride and silicon oxide. In the example of FIG. 4, the first barrier layer 37 is formed by forming three-layered layer (silicon oxide layer 37b and silicon nitride layers 37a each formed at upper and lower sides of the silicon oxide layer 37b) on the substrate 2. The silicon nitride layer 37a and the silicon oxide layer 37b are formed by the Plasma-Enhanced Chemical Vapor Deposition (PECVD) or sputtering for example.

Then, a plurality of organic EL display elements are formed on the first barrier layer 37. The TFT 31, the first and second electrodes 33, 35, and the organic layer 34 which constitute the organic EL display elements can be formed by any method including a well-known method and thus a detailed description thereof is omitted. In addition, in a case where a liquid crystal display panel is formed as the display panel 3, each electrode, alignment films, polarization films, and liquid crystal layer which constitute the liquid crystal display elements can be formed by any method including a well-known method. Therefore, a detailed description thereof is omitted.

After formation of the display elements 3a, preferably, a second barrier layer 38 is formed by depositing at least two layers on the display elements 3a, each formed using a moisture impermeable material. Examples of the moisture impermeable material include silicon nitride, silicon oxide, and silicon nitride oxide. In the example of FIG. 4, on the display elements 3a, a silicon nitride layer 38a, a silicone oxide layer 38b, and further, an organic layer 38c are formed sequentially, and onto that, a silicon oxide layer 38b and a silicon nitride layer 38a are formed again. The organic layer 38c is formed, for example, by printing an epoxy resin or an acrylic resin by using an inkjet printer. The silicon nitride layers 37a and the silicon oxide layers 37b are formed by, for example, the PECVD or sputtering. In a case where the second barrier layer 38 is formed, for example, only the silicon nitride layer 38a and the organic layer 38c may be formed. Thus, in the method for manufacturing display apparatus according to Embodiment 1, the barrier layers (the first barrier layer 37 and the second barrier layer 38) are formed preferably at either one of or both of a position between the substrate 2 and the display elements 3a and a position on the display elements 3a.

Referring to FIG. 12A again, the method for manufacturing display apparatus according to Embodiment 1 will be described. Preferably, prior to providing the holding member 4 at the outer edge of the display panel, the wiring 9 composed of, for example, FPC is prepared, and the wiring 9 is connected to the display panel 3. Specifically, one end of the wiring 9 and a contact pad 3e which is provided on the display panel 3 using a conductive material are electrically and mechanically connected to each other. For example, the wiring 9 and the display panel 3 are connected to each other by pressurizing and heating them while an anisotropic conductive film (ACF) is interposed between the wiring 9 and the display panel 3. Before the holding member 4 is provided on the display panel 3, the wiring 9 and the display panel 3 can be easily pressurized and heated regardless of heat resistance of the holding member 4.

Figure 12B:
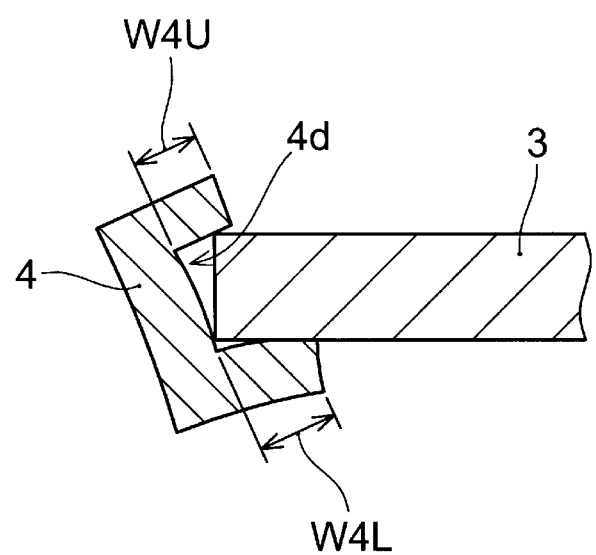
FIG. 12B shows an example of method for engaging display panel and holding member in the example of the method for manufacturing shown in FIG. 12A.

Thus, preferably, after the wiring 9 has been connected to the display panel 3, the holding member 4 engaging with the outer periphery of the display panel 3 is provided at the outer edge of the display panel 3. The holding member 4 is preferably provided in the frame-like shape at the entire of the outer edge of the display panel 3. For example, as shown in FIG. 12A, the holding member 4 formed in the frame-like shape as a whole and having the groove 4d on the interior wall is prepared. The periphery of the display panel 3 is inserted into the groove 4d. The holding member 4 provided with the groove 4d is prepared by, for example, molding processing of a synthetic resin or a natural resin. Preferably, the holding member 4 is formed using, for example, a silicone resin so as to have elasticity and flexibility. The holding member 4 is engaged with the display panel 3, preferably, from a position facing a surface of the display panel 3 opposite to a surface to which the wiring 9 is connected. Even if the wiring 9 has been already connected to the display panel 3, the periphery of the display panel 3 can be inserted into the groove 4d. In a case where the holding member 4 has elasticity or flexibility, as shown in FIG. 12B, when the periphery of the display panel 3 is inserted into the groove 4d, the periphery of the display panel 3 can be easily inserted into the groove 4d by deforming the holding member 4. Moreover, at each edge of the frame-like holding member 4, lengths W4U, W4L of each of a pair of contact parts constituting two opposite interior walls of the groove 4d and extending to the inside of the frame-like holding member 4 may be different from each other. In that case, when the periphery of the display panel 3 is inserted into the groove 4d, the shorter contact part is fit to the display panel 3 after fitting the longer contact part as shown in FIG. 12B, thereby, the periphery of the display panel 3 can be more easily inserted into the groove 4d.

Next, the supporting member 5 having the surface 5a on which the substrate 2 of the display panel 3 is to be placed is prepared, and the holding member 4 is bonded to the surface 5a of the supporting member 5. Then, preferably together with the bonding, the substrate 2 of the display panel 3 is brought into close contact with the surface 5a of the supporting member 5. The substrate 2 is brought into close contact with the surface 5a at a strength lower than the bonding strength between the holding member 4 and the surface 5a of the supporting member 5. The supporting member 5 may be prepared by processing any material, for example, glass, metal, or resin by any manner; alternatively, the existing article may be prepared as the supporting member 5. The holding member 4 is bonded to the supporting member 5 using the adhesive 8, for example. The holding member 4 is pressed against the supporting member 5 as required. In addition, whenever necessary, heating processing is performed for curing of the adhesive 8. The adhesive 8 may be applied to either one of or both of a bonding surface of the holding member 4 and the surface 5a of the supporting member 5, or as shown in FIG. 12A, the adhesive 8 may be placed between the holding member 4 and the supporting member 5 after being molded into a form of frame-like sheet. For the adhesive 8, any adhesive agent such as an acrylic-based one, a silicone-based one, or a urethane-based one is used.

In the example shown in FIG. 12A, the substrate 2 of the display panel 3 is brought into close contact with the surface 5a of the supporting member 5 via the weak adhesive layer 6. In other words, the method for manufacturing display apparatus according to Embodiment 1 may further include forming the weak adhesive layer 6 composed of an adhesive agent on the surface 5a of the supporting member 5 or on a surface of the substrate 2 opposite to a surface facing the display elements 3a. The weak adhesive layer 6 can be formed by disposing a weak adhesive sheet, formed using an adhesive agent, on the surface 5a of the supporting member 5 or the surface of the substrate 2 opposite to the surface facing the display elements 3a. The adhesive agent constituting the weak adhesive layer 6 can include acrylic-based, silicone-based or urethane-based resin solely or in combination of a plurality thereof as main component. By forming the weak adhesive layer 6, the substrate 2 is brought into close contact with the surface 5a of the supporting member 5 via the weak adhesive layer 6 at a strength lower than the bonding strength between the holding member 4 and the surface 5a of the supporting member 5.

Figure 12C:
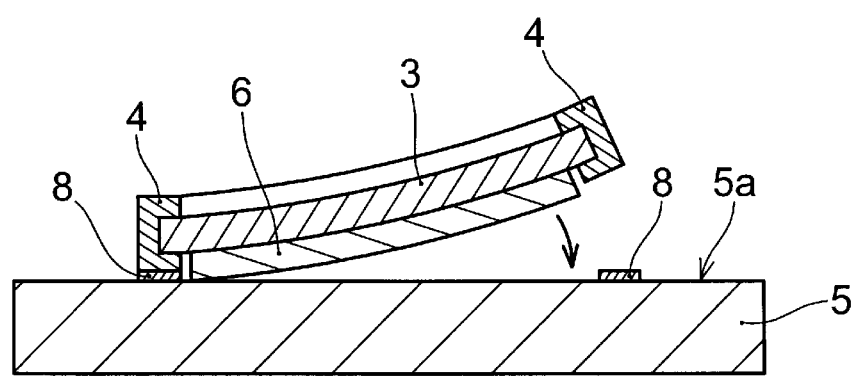
FIG. 12C shows an example of a step of bringing a display panel into close contact with a supporting member in the example of the method for manufacturing shown in FIG. 12A.

It is preferable that the substrate 2 of the display panel 3 is brought into close contact with the supporting member 5 without entrapping, for example, air bubbles. Therefore, the display panel 3 is subsequently placed on the surface 5a of the supporting member 5 from the one end while being bended as shown in FIG. 12C. At this step, as shown in FIG. 12C, the holding member 4 also needs to be bended. It is preferable to form the holding member 4 to be flexible so that the display panel 3 can be placed on the supporting member 5 by a method which hardly entraps air bubbles. The display apparatus 1 will be completed by, for example, carrying out the above-mentioned steps.

When the frame-like holding member 4 is prepared, the through hole 41a (refer to FIG. 10A) or the through hole 41b and the groove 42 (refer to FIG. 10B) through which the inside and the outside of the frame-like shape of the holding member 4 are communicated may be formed. In that case, the method for manufacturing display apparatus according to Embodiment 1 may include suctioning gas from the inside of the frame-like shape of the holding member 4 by using the through hole 41a or the through hole 41b and the groove 42 after bonding the holding member 4 to the surface 5a of the supporting member 5. By such suction, the substrate 2 may be brought into close contact with the surface 5a of the supporting member 5. The space S surrounded by the holding member 4 becomes a reduced pressure state or a vacuumed state, thereby, the substrate 2 can be brought into much better close contact with the supporting member 5. In addition, penetration of the air inside the space S or the moisture therein to the interface between the display panel 3 and the supporting member 5 can be prevented. The through holes 41a, 41b and the groove 42 can be formed by providing a projection part corresponding to the through holes 41a, 41b and the groove 42 in a molding die used when forming the holding member 4 or performing cutting processing with a drill or the like after forming the holding member 4. Suctioning the gas from the inside of the frame-like holding member 4 can be performed using any suctioning means, for example, suction pump. Inflow of the air into the space S after the suction can be prevented by the closing member 44 (refer to FIG. 10A and FIG. 10B).

Figure 13:
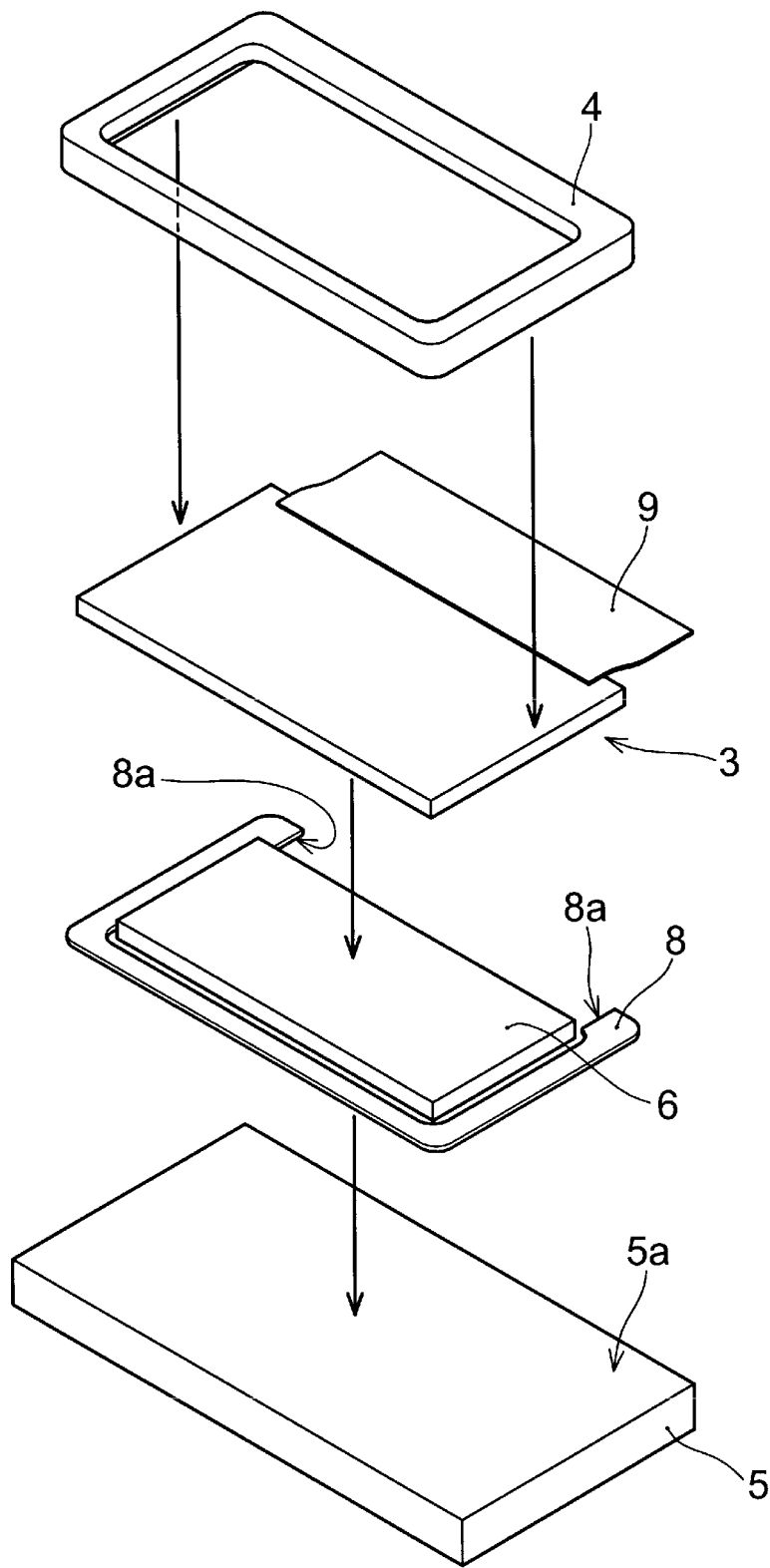
FIG. 13 shows another example of method for manufacturing display apparatus according to Embodiment 1 of the present invention.

FIG. 13 shows another example of the method for manufacturing display apparatus according to Embodiment 1. In accordance with the example of the method for manufacturing shown in FIG. 13, the display apparatus 1 of the example shown in FIG. 8 can be manufactured for example. Therefore, the holding member 4 shown in FIG. 13 has an L-shaped cross-sectional shape at each edge of the frame-like shape. In addition, when the holding member 4 and the supporting member 5 are bonded to each other, the connection part between the display panel 3 and the wiring 9 is housed in the concave portion 4a (FIG. 8) formed at a portion at which the holding member 4 and the wiring 9 face each other. In addition, in the example shown in FIG. 13, the holding member 4 does not abut on the supporting member 5 at the portion facing the wiring 9, and thus, the adhesive 8 is not provided at the entire of the outer edge of the display panel 3 but applied or disposed so as to have a discontinuous portion 8a.

In addition, the example shown in FIG. 13 is different from the example shown in FIG. 12A in that the holding member 4 is engaged with the display panel 3 from a surface of the display panel 3, on which the wiring 9 has been connected. The holding member 4 shown in FIG. 13 has an L-shaped cross-sectional shape at each edge as described above and thus it can be engaged with the display panel 3 from a position facing a surface of the display panel 3 on which the wiring 9 is connected. Therefore, engaging the holding member 4 with the display panel 3, bonding the holding member 4 to the supporting member 5, and bringing the substrate 2 of the display panel 3 into close contact with the surface 5a of the supporting member 5 can be efficiently carried out. In the method for manufacturing display apparatus according to Embodiment 1, the weak adhesive layer 6 may not always be formed. In other words, the "close contact" between the display panel 3 and the supporting member 5, as described above, may be provided by such as the press with the holding member 4, the electrostatic action, or the decompression adsorbing action.

SUMMARY

According to a configuration of a first aspect of the present invention, a display panel to be used being fixed to a supporting member can be easily detached from the supporting member.

According to a configuration of a second aspect of the present invention, permeation of moisture passing through the inside of a display panel to an interface between the display panel and a supporting member can be reduced.

According to a configuration of a third aspect of the present invention, permeation of moisture passing through the inside of a display panel to an interface between the display panel and a supporting member can be extremely reduced.

According to a configuration of a fourth aspect of the present invention, a first barrier layer having a high barrier performance and being unlikely to let a crack or the like occur can be obtained.

According to a configuration of a fifth aspect of the present invention, a second barrier layer unlikely to be influenced by undesired particles or the like on a display element, thereby, having stable quality can be obtained.

According to a configuration of a sixth aspect of the present invention, adhesion strength between a silicon nitride layer or a silicon nitride oxide layer and an organic layer can be improved.

According to a configuration of a seventh aspect of the present invention, a display panel and a supporting member can be substantially securely brought into close contact with each other.

According to a configuration of an eighth aspect of the present invention, during use of a display apparatus, a display panel is hardly separated from a supporting member and when the display panel is intentionally separated from the supporting member, the display panel and the supporting member can be easily separated from each other.

According to a configuration of a ninth aspect of the present invention, at the time of detachment of a display panel, a weak adhesive layer can be left on a desired one of the display panel and a supporting member.

According to a configuration of a tenth aspect of the present invention, at the time of detachment of a display panel, a weak adhesive layer can be more securely left on a desired one of the display panel and a supporting member.

According to a configuration of an eleventh aspect of the present invention, at the time of detachment of a display panel, a weak adhesive layer can be left on the display panel.

According to a configuration of a twelfth aspect of the present invention, a display panel can be brought into close contact with a surface of a supporting member which is a quadratic surface.

According to a configuration of a thirteenth aspect of the present invention, a holding member can be stably fixed to a supporting member.

According to a configuration of a fourteenth aspect of the present invention, a user of a display apparatus can see a scene of a region in which a field of vision is to be obstructed by the display apparatus unless the configuration of the fourteenth aspect is provided.

According to a configuration of a fifteenth aspect of the present invention, a user of a display apparatus can see a scene of a region in which a field of vision is to be obstructed by a holding member unless the configuration of the fifteenth aspect is provided.

According to a configuration of a sixteenth aspect of the present invention, in a case where either a windshield or a display panel is broken, the display panel can be detached from the windshield without causing severe damage to the unbroken display panel or unbroken windshield.

According to a configuration of a seventeenth aspect of the present invention, a display panel and a supporting member can be brought into more secure close contact with each other.

According to a configuration of an eighteenth aspect of the present invention, a driver and a display panel can be easily separated from each other.

According to a configuration of a nineteenth aspect of the present invention, a display panel can be used while being brought into close contact with an external support easily, and can be easily detached from the support after use of the display panel.

DESCRIPTION OF REFERENCE NUMERAL 1, 1a Display apparatus
2 Substrate
3 Display panel
37 First barrier layer
37a Silicon nitride layer
37b Silicon oxide layer
38 Second barrier layer
38a Silicon nitride layer
38b Silicon oxide layer
38c Organic layer
3a Display element
4 Holding member
41a, 41b Through hole
42 Groove
44 Closing member
5 Supporting member
5a Surface
6 Weak adhesive layer
7 Strong adhesive layer
8 Adhesive
9 Wiring
91 Terminal
9a Connector
DR Driver

The invention claimed is:
1. A display apparatus comprising:
a display panel comprising a plurality of display elements arranged in a matrix form on a substrate having flexibility; and a holding member provided at a part of or an entire of an outer edge of the display panel along the outer edge, so as to rim the display panel,
wherein the holding member has flexibility and has a rigidity higher than a rigidity of the substrate,
a weak adhesive layer composed of an adhesive agent is formed on a surface of the substrate opposite to a surface facing the display elements,
the holding member is attached to the edge of the display panel such that the display panel is detachable from the holding member,
the holding member has a frame shape surrounding the display panel and comprises a first contact part facing a top surface of the display panel, and
the holding member further comprises a second contact part facing a bottom surface of the display panel and surrounding the weak adhesive layer, the bottom surface being the surface of the substrate on which the weak adhesive layer is formed.

2. The display apparatus according to claim 1, wherein
the holding member has the frame shape surrounding the display panel along the entire of the outer edge,
the holding member comprises:
a through hole or a groove communicating with an inside of the frame shape of the holding member and communicating with an outside of the frame shape of the holding member; and
a closing member to prevent ventilation through the through hole or the groove,
the through hole or the groove is formed at an edge of the holding member, and
the closing member is arranged inside of the through hole or the groove.

3. The display apparatus according to claim 1, wherein
each of the display elements comprises a thin film transistor formed over the substrate, and
the display apparatus further comprises a barrier layer between the thin film transistor and the substrate and on the display elements, the barrier layer being formed using a moisture impermeable material.

4. The display apparatus according to claim 3, wherein a water vapor transmission rate of the barrier layer is $10^{-4}$ g/m²/day or less.

5. The display apparatus according to claim 3, wherein a first barrier layer is formed as the barrier layer between the thin film transistor and the substrate, and
the first barrier layer is a multilayered layer comprising a silicon nitride layer and a silicon oxide layer.

6. The display apparatus according to claim 3, wherein a second barrier layer is formed as the barrier layer on the display elements, and
the second barrier layer is a multilayered layer comprising a silicon nitride layer or a silicon nitride oxide layer, and an organic layer composed of an organic material.

7. The display apparatus according to claim 1, wherein an adhesion strength between the weak adhesive layer and the substrate is 0.02 N/10 mm or more and 5.0 N/10 mm or less.

8. The display apparatus according to claim 1, further comprising a strong adhesive layer being bonded to the weak adhesive layer and having an adhesive force equal to or more than an adhesive force of the weak adhesive layer.

9. The display apparatus according to claim 1, wherein the display panel is a transparent organic EL display panel formed using a light transmissive material.

10. The display apparatus according to claim 1, wherein the holding member is formed using a light transmissive material.

11. The display apparatus according to claim 1, further comprising a wiring to connect the display panel and a driver supplying a drive signal to the display panel,
wherein the wiring is attached to the display panel at one end of the wiring and comprises a terminal provided at an opposite end to the one end, the terminal being adaptive to a connector being provided to the driver.

12. The display apparatus according to claim 1, wherein the substrate of the display panel is configured to be placed on a surface of a vehicle windshield.

13. The display apparatus according to claim 1, further comprising a supporting member to support the display panel,
wherein the weak adhesive layer is formed between the display panel and the supporting member so as to be detachable from the display panel and the supporting member.

14. The display apparatus according to claim 1, wherein
at each edge of the holding member having the frame shape, a length of the first contact part in a direction extending toward an inside of the holding member and a length of the second contact part in the direction are different from each other.

15. A display apparatus comprising:
a display panel comprising a plurality of display elements arranged in a matrix form on a substrate having flexibility; and
a holding member provided at a part of or an entire of an outer edge of the display panel along the outer edge, so as to rim the display panel,
wherein the holding member has flexibility and has a rigidity higher than a rigidity of the substrate,
a weak adhesive layer composed of an adhesive agent is formed on a surface of the substrate opposite to a surface facing the display elements,
the holding member is attached to the edge of the display panel such that the display panel is detachable from the holding member,
each of the display elements comprises a thin film transistor formed over the substrate,
the display apparatus further comprises a barrier layer between the thin film transistor and the substrate and on the display elements, the barrier layer being formed using a moisture impermeable material,
a second barrier layer is formed as the barrier layer on the display elements,
the second barrier layer is a multilayered layer comprising a silicon nitride layer or a silicon nitride oxide layer, and an organic layer composed of an organic material,
the second barrier layer comprises:
a first silicon nitride layer on the display elements;
a first silicon oxide layer on the first silicon nitride layer;
the organic layer on the first silicon oxide layer;
a second silicon oxide layer on the organic layer; and
a second silicon nitride layer on the second silicon oxide layer, and
irregularities on a surface of the first silicon oxide layer are embedded in the organic layer.

16. A display apparatus comprising:
a display panel comprising a plurality of display elements arranged in a matrix form on a substrate having flexibility; and
a holding member provided at a part of or an entire of an outer edge of the display panel along the outer edge, so as to rim the display panel, wherein the holding member has flexibility and has a rigidity higher than a rigidity of the substrate, a weak adhesive layer composed of an adhesive agent is formed on a surface of the substrate opposite to a surface facing the display elements, the holding member is attached to the edge of the display panel such that the display panel is detachable from the holding member, the holding member comprises a part provided on the surface of the substrate on which the weak adhesive layer is formed, and above the surface of the substrate on which the weak adhesive layer is formed, the weak adhesive layer protrudes from a surface of the holding member opposite to the substrate.

* * * * *